United States Patent
Haga et al.

(10) Patent No.: US 9,529,473 B2
(45) Date of Patent: Dec. 27, 2016

(54) ELECTRONIC DEVICE, ELECTROSTATIC CAPACITANCE SENSOR AND TOUCH PANEL

(71) Applicant: NLT TECHNOLOGIES, LTD., Kawasaki, Kanagawa (JP)

(72) Inventors: Hiroshi Haga, Kanagawa (JP); Hideki Asada, Kanagawa (JP); Daisuke Sugimoto, Kanagawa (JP)

(73) Assignee: NLT TECHNOLOGIES, LTD., Kawasaki, Kanagawa (JP)

(*) Notice: Subject to any disclaimer, the term of this patent is extended or adjusted under 35 U.S.C. 154(b) by 63 days.

(21) Appl. No.: 14/434,982

(22) PCT Filed: Oct. 11, 2013

(86) PCT No.: PCT/JP2013/077861
§ 371 (c)(1),
(2) Date: Apr. 10, 2015

(87) PCT Pub. No.: WO2014/058070
PCT Pub. Date: Apr. 17, 2014

(65) Prior Publication Data
US 2015/0286335 A1    Oct. 8, 2015

(30) Foreign Application Priority Data

Oct. 12, 2012  (WO) .................. PCT/JP2012/076370

(51) Int. Cl.
*G06F 3/041*  (2006.01)
*G06F 3/045*  (2006.01)
(Continued)

(52) U.S. Cl.
CPC .............. *G06F 3/0416* (2013.01); *G06F 3/044* (2013.01); *G06F 3/0418* (2013.01); *H03K 17/962* (2013.01); *H03K 2217/960705* (2013.01)

(58) Field of Classification Search
CPC ...... G06F 3/0416; G06F 3/044; G06F 3/0418; H03K 2217/960705; H03K 17/962
(Continued)

(56) References Cited

U.S. PATENT DOCUMENTS

| | | | | |
|---|---|---|---|---|
| 2010/0060593 A1* | 3/2010 | Krah | .................. | G06F 3/0416 345/173 |
| 2011/0061948 A1* | 3/2011 | Krah | .................. | G06F 3/0418 178/18.01 |

(Continued)

FOREIGN PATENT DOCUMENTS

| | | |
|---|---|---|
| EP | 2752739 A1 | 7/2014 |
| JP | 60-65620 A | 4/1985 |
| JP | 4-66878 A | 3/1992 |
| JP | 2006-106853 A | 4/2006 |
| JP | 2007-334606 A | 12/2007 |
| JP | 2010-86285 A | 4/2010 |
| JP | 2011-13757 A | 1/2011 |
| JP | 2011-14109 A | 1/2011 |
| JP | 2011-69673 A | 4/2011 |

OTHER PUBLICATIONS

International Search Report for PCT/JP2013/077861 dated Nov. 5, 2013 [PCT/ISA/210].

(Continued)

*Primary Examiner* — Amit Chatly
(74) *Attorney, Agent, or Firm* — Sughrue Mion, PLLC

(57) ABSTRACT

When an excitation frequency of a touch panel is coincident with or in the vicinity of a frequency of external noise, noise cannot be removed by a bandpass filter. Also when a touch detecting operation period is limited to a short period of time such as a non-address period, frequency resolution is reduced and a noise removal effect of averaging is reduced, so that an S/N ratio is decreased. The electronic apparatus of the present invention includes a sensor system 101, an excitation generating unit 102 which generates an intermittent sine wave signal and applies the same to the sensor system, and a demodulation unit 105 which demodulates an amplitude modulated signal which is an output of the sensor system, in which the demodulation unit generates a demodulated signal $D(t)$ using both a response $x1(t)$ of the sensor (Continued)

system in a period when the excitation generating unit outputs a sine wave and a response $z1(t)$ of the sensor system in a period, at least either immediately before or immediately after the above-mentioned period, when the excitation generating unit does not output a sine wave.

17 Claims, 30 Drawing Sheets

(51) Int. Cl.
  *G06F 3/044* (2006.01)
  *H03K 17/96* (2006.01)
(58) Field of Classification Search
  USPC .................................................. 345/173–178
  See application file for complete search history.

(56) References Cited

U.S. PATENT DOCUMENTS

2011/0134076 A1   6/2011  Kida et al.
2012/0050217 A1   3/2012  Noguchi et al.
2012/0162134 A1*  6/2012  Chen .................... G09G 3/3648
                                          345/174

OTHER PUBLICATIONS

Communication dated Apr. 25, 2016, from the European Patent Office in counterpart European Application No. 13845463.2.

* cited by examiner $$M = \frac{1}{T}\int_0^T \left(A_S - \frac{A_S - A_E}{T}t\right)\cos\left(\theta_S - \frac{\theta_S - \theta_E}{T}t\right)dt$$

$$+ j\left\{\frac{1}{T}\int_0^T \left(A_S - \frac{A_S - A_E}{T}t\right)\sin\left(\theta_S - \frac{\theta_S - \theta_E}{T}t\right)dt\right\}$$

(a) VECTORS Y, Z AND M (b) VECTORS X, M AND X-M (a) angle[$Y_{1,s}$]

(b) angle[$Z_{1,s}$]

(a) angle[$Y_{1,s}$]

(b) angle[$Z_{1,s}$]

(a) angle[$Y_{1,s}$]'

(b) angle[$Z_{1,s}$]'

(a) angle[$Y_{1,s}$]'

(b) angle[$Z_{1,s}$]'

ELECTRONIC DEVICE, ELECTROSTATIC CAPACITANCE SENSOR AND TOUCH PANEL

CROSS REFERENCE TO RELATED APPLICATIONS

This application is a National Stage of International Application No. PCT/JP2013/077861, filed on Oct. 11, 2013, which claims priority from International Application No. PCT/JP2012/076370, filed on Oct. 12, 2012, the contents of all of which are incorporated herein by reference in their entirety.

FIELD OF THE INVENTION

The present invention relates to an electronic device, a electrostatic capacitance sensor and a touch panel and, in particular, to an electronic device, a electrostatic capacitance sensor and a touch panel that use an amplitude modulation and demodulation system.

BACKGROUND ART

A touch panel is a device that detects the coordinates of a position pointed to by a pointing object such as a finger or a pen, or detects a pointing action by such a pointing object. Today, touch panels are typically used in combination with a display such as a Liquid Crystal Display (LCD), a Plasma Display Panel (PDP), or an organic EL display.

Outputs from a touch panel are input into a computer, which controls images displayed on the display and controls a device, thereby implementing an easy-to-use human interface. Touch panels are now used in a wide range of everyday-life applications such as video game machines, portable information terminals, ticket-vending machines, automatic teller machines (ATMs), and automobile navigation systems. As computers grow more powerful and network connection environments become widespread, a wider variety of services are provided through electronic devices and the need for displays with a touch panel is increasing.

One type of touch panel is a surface capacitive touch panel. The surface capacitive touch panel includes (i) a resistive sheet and (ii) drive and sensing circuitry which is connected to the resistive sheet, applies an AC voltage (sinusoidal voltage) to the resistive sheet as an excitation, measures a current flowing through the resistive sheet, and outputs the measurement.

Specifically, the surface capacitive touch panel includes a transparent substrate, a transparent resistive sheet formed on the surface of the transparent substrate, and a thin insulating film formed on the top surface of the resistive sheet. The resistive sheet is referred to as the position sensing conductive film. To drive the touch panel of this type, an AC voltage is applied to the four corners of the position sensing conductive film. When the touch panel is touched with a human finger, a pointing stick or the like (hereinafter referred to as the indicator), a capacitor is formed by capacitive coupling between the position sensing conductive film and the indicator. A small current flows to the indicator via the capacitor. The current flows from the corners of the position sensing conductive film to the point touched with the indicator. A signal processing circuit calculates whether or not there is a touch with an indicator and, the coordinate of the position touched with the indicator on the basis of the current detected by the drive and sensing circuitry. Specifically, the signal processing circuit detects the presence or absence of a touch on the basis of the sum of currents from the four corners of the position sensing conductive film. In addition, the coordinates of the touch position is calculated on the basis of the ratio of the currents from the four corners of the position sensing conductive film.

Touch panels based on the surface capacitive operation principle described above are disclosed in Patent Literatures 1 to 5.

A device in Patent Literature 1, which includes a display panel and a touch panel combined and operated together, is equipped with counter-electrode driving means for applying an AC voltage to the touch panel during a non-display period of the display panel and applying the same AC voltage to the counter electrodes of the display panel in order to prevent decrease in the precision of position detection due to a drive signal for the display panel.

Patent Literature 2 discloses a "touch panel device in which when noise is large, the level of AC voltage oscillation is increased whereas when noise is small, the AC voltage oscillation level is decreased and, when there is noise with a specific frequency, switching is made to a different voltage oscillation frequency, thereby ensuring safety to achieve an improved signal-to-noise ratio, high noise robustness, and electrical safety".

Patent Literature 3 states that "a phase and an AC voltage when a finger has touched the panel are set as a contact vector signal and a scalar quantity calculated from the phase difference between the two signals and amplitudes by using the cosine theorem is set as an AC signal of the actual finger touch, thereby excluding the AC voltage due to a parasitic signal when a finger is not near the resistive sheet or the phase difference between the signals due to a finger of a capacitive grounding human body or a resistive grounding human body from the detection of the touch position".

Patent Literature 4 discloses that "the operational circuit takes an input of an output from the long sensor line LSLi and an output from the short sensor line SSLi and performs a computation using the difference (Delta) between the outputs and the line capacitance ratio Kc to obtain a signal component S".

Patent Literature 5 discloses that "the four nodes are labeled with symbols Na, Nb, Nc and Nd. Terminals of current sensing circuits, which will be described later, are connected to the nodes" and states that "single-pole double-throw switches 21a to 21d are connected to the nodes Na to Nd through current sensing circuits 13a to 13d. An AC voltage source 22 is connected to one of the two contacts of each of the single-pole double-throw switches 21a to 21d and a storage capacitance line drive circuit is connected to the other contact (i.e. a node labeled with COM in FIG. 4). The waveform of an AC voltage may be a sinusoidal wave, for example".

On the other hand, the patent applicant including the present inventor presented several proposals in Patent Document 6 and Non-Patent Document 1 to attain an object of "detecting touching or non-touching, or a touch position with high precision by removing noise whose frequency is the same as a signal frequency or as close to the signal frequency as cannot be resolved by a conventional frequency resolution".

PRIOR ART LITERATURE

Patent Literature

Patent Literature 1: Japanese Laid-open Patent Publication No. 2007-334606

Patent Literature 2: Japanese Laid-open Patent Publication No. 2006-106853
Patent Literature 3: Japanese Laid-open Patent Publication No. 2010-86285
Patent Literature 4: Japanese Laid-open Patent Publication No. 2011-13757
Patent Literature 5: Japanese Laid-open Patent Publication No. 2011-14109
Patent Literature 6: Published Japanese Translation of PCT International Publication for Patent Application No. 2011-069673.

Non-Patent Document

Non-Patent Document 1 H. Haga et al., "A 10.4-in. On-Cell Touch-Panel LCD with Correlated Noise Subtraction Method," SID' 12 Digest, pp 489-492 (2012) Society for Information Display 2012 International Symposium

SUMMARY OF THE INVENTION

Problems to be Solved by the Invention

The following analysis has been made by the present inventors. The touch panel described in Patent Literature 1 has the following six problems.

A first problem is that the touch panel is sensitive to external noise (electric field variations and capacitive coupling noise). While Patent Literature 1 states that decrease in the precision of position detection due to the drive signal for the display panel is prevented, the touch panel is susceptible to external noise from sources other than the drive signal for the display panel, for example noise emitted from a fluorescent lamp including an inverter circuit that is located above the touch surface of the touch panel.

One reason for the problem is based on the operating principle of the touch panel. Since a surface capacitive touch panel detects the capacitance of a capacitor formed between the position sensing conductive film and a finger, a shied electrode for shielding an electric field may not be formed between the position sensing conductive film and a finger. Therefore, the touch surface of the position sensing conductive film inevitably has a structure that is vulnerable to external noise. The larger the size of the touch panel, the more susceptible to external noise the touch panel is.

Another reason is that the number of noise sources is increasing. For example, inverter fluorescent lamps developed for reducing flickering are accepted in the marketplace and are increasing in number. In addition, more and more switching-mode power supplies, developed in order to increase the efficiency of supply voltage conversion, are being used in rechargers and AC adapters for portable devices. Noise generated from these devices prevents normal operation of capacitance sensing devices.

A second problem is that a bandpass filter may not remove noise when the excitation frequency of the touch panel is equal or close to the frequency of the noise.

The fundamental frequency of noise illustrated above or the frequency of harmonic of noise is equal or close to the excitation frequency of the touch panel. A synchronous detector described in Patent Literature 1 is claimed to perform filtering in order to filter out noise with frequencies different from the excitation frequency. Accordingly, the method that decomposes an observed signal by frequency to select a frequency in this way may not remove noise that has the frequency equal to the excitation frequency.

When the frequency of noise is close to the excitation frequency, noise passes through an attenuation band (or a transition band) between the passband and the stopband of the bandpass filter hence the output of the bandpass filter contains noise. In other words, a practicable bandpass filter has certain frequency resolution limits and therefore may not remove noise with frequencies that are close to the excitation frequency.

A third problem is that if a touch sensing operation time period is restricted by a non-display period (non-addressing period) or the like, frequency resolution decreases so that noise close to the frequency of a true signal may not be removed. For example, when a signal of interest includes two sinusoidal wave signals having the same amplitude, a periodogram spectral estimation method can resolve such spectral peaks that satisfy $$\Delta f \geq \frac{1}{T} \qquad \text{[Formula 1]}$$

where T is a signal acquisition time period.

In the method, when the signal acquisition time period T is 500 microseconds, $\Delta f$ is 2 kHz, and therefore, when assuming a true signal of 100 kHz and noise of 99 kHz, both may not be able to be resolved by frequency.

A fourth problem is that the effect of noise removal by averaging decreases and the signal-to-noise ratio decreases. For example, when an observed signal on which Poisson distribution noise is superimposed is acquired many times and averaged to cancel out noise, thereby reducing the noise, the amount of noise reduction is proportional to the square root of the number of the times the observed signal has been acquired. In other words, when the signal acquisition time period is limited to a short time period such as non-display period (non-addressing period), the effect of the noise removal by averaging decreases and the signal-to-noise ratio decreases.

A fifth problem is that if a structure in which a polarizer is placed between a position sensing conductive film and a finger is used as illustrated in Japanese Patent Application No. 2009-163401 by the present applicant, capacitance formed between the position sensing conductive film and the finger is reduced and the signal-to-noise ratio may decrease. Similarly, if a protective glass or the like is inserted between the position sensing conductive film and a finger, the signal-to-noise ratio may decrease.

A sixth problem, which is yet to be solved by the inventor and the applicant of the present invention in Patent Document 6 and Non-Patent Document 1, is a need for obtaining a high S/N ratio with respect to more various noises. In Patent Document 6, $|X_n - M_n|$ is calculated for every n (n is the number 1, 2, 3, . . . sequentially assigned to a non-address period) and a resultant value is taken as an output of a demodulating unit. The inventor of the present application, however, found that calculating $|X_n - M_n|$ for every n might cause reduction in an S/N ratio in some cases.

Therefore, there is the problem of providing an electronic device, a electrostatic capacitance sensor, and a touch panel that are capable of removing noise with a frequency equal to the frequency of a signal or close to the frequency of a signal that the noise may not be resolved with conventional frequency resolutions and are therefore capable of precisely detecting the presence or absence of a touch and a touch position.

Means for Solving the Problem

An electronic apparatus according to the present invention aiming at solving the above problems is an electronic apparatus including a sensor system; an excitation generating unit which generates an intermittent sine wave signal and applies the same to the sensor system; and a demodulating unit which demodulates an amplitude modulated signal as an output of the sensor system, in which the demodulating unit generates a demodulated signal using both a response of the sensor system in a period when the excitation generating unit outputs a sine wave and a response of the sensor system in a period, at least either immediately before or immediately after the aforementioned period, when the excitation generating unit does not output a sine wave, and with a vector as X, which is obtained from an amplitude and a phase of a frequency component of a sine wave that are calculated from the response of the sensor system in a period when the excitation generating unit outputs the sine wave, and with vectors as Y and Z, which are obtained from an amplitude and a phase of a frequency component of a sine wave that are respectively calculated from the response of the sensor system in periods, immediately before and immediately after the aforementioned period, when the excitation generating unit does not output a sine wave, the demodulated signal corresponds to a constant multiplication of $|X-k\cdot M|$ in which M represents a mean vector of Y and Z, and k represents a coefficient whose value is determined using a response of the sensor system in a period when the excitation generating unit does not output a sine wave.

In order to solve the above problems, an electrostatic capacitance sensor according to the present invention includes an electronic apparatus including a resistive sheet; and a sensor system configured with a driving and detecting circuit connected to the resistive sheet for applying a voltage to the resistive sheet to measure and output current flowing through the resistive sheet, in which a touching state or coordinates of an indicator are detected by detecting an electrostatic capacitance of a capacitor formed by the resistive sheet and the indicator.

Or the electrostatic capacitance sensor includes an electrode; and a sensor system configured with a driving and detecting circuit connected to the electrode for applying a voltage to the electrode to measure and output current flowing through the electrode, in which a touching state or coordinates of an indicator are detected by detecting an electrostatic capacitance of a capacitor formed by the electrode and the indicator.

Further provided are a first electrode; a second electrode; and a sensor system configured with a driving circuit which applies a voltage to the first electrode and a detecting circuit which measures and outputs current flowing through the second electrode, in which a touching state or coordinates of an indicator are detected by detecting an electrostatic capacitance of a capacitor formed by the first electrode and the second electrode.

A display device is further included, in which a non-address period of the display device has a period when the excitation generating unit outputs a sine wave and a period when the unit does not output a sine wave, and a demodulated signal is generated using both a response of the sensor system in the period when a sine wave is output and a response of the sensor system in the period when the sine wave is not output.

In addition, in order to solve the above problems, a touch panel according to the present invention includes a resistive sheet; and a sensor system configured with a driving and detecting circuit connected to the resistive sheet for applying a voltage to the resistive sheet to measure and output current flowing through the resistive sheet, in which a touching state or coordinates of an indicator are detected by detecting an electrostatic capacitance of a capacitor formed by the resistive sheet and the indicator.

Or the touch panel includes an electrode; and a sensor system configured with a driving and detecting circuit connected to the electrode for applying a voltage to the electrode to measure and output current flowing through the electrode, in which a touching state or coordinates of an indicator are detected by detecting an electrostatic capacitance of a capacitor formed by the electrode and the indicator.

On the other hand, in order to solve the above problems, the touch panel according to the present invention includes a first electrode; a second electrode; and a sensor system configured with a driving circuit which applies a voltage to the first electrode and a detecting circuit which measures and outputs current flowing through the second electrode, in which a touching state or coordinates of an indicator are detected by detecting an electrostatic capacitance of a capacitor formed by the first electrode and the second electrode.

Besides, in order to solve the above problems, the electronic apparatus according to the present invention is configured to include a display device, in which a non-address period of the display device has a period when the excitation generating unit outputs a sine wave and a period when the unit does not output a sine wave, so that a demodulated signal is generated using both a response of the sensor system in the period when the sine wave is output and a response of the sensor system in the period when the sine wave is not output.

By contrast, the touch panel is configured to include a display device, in which a non-address period of the display device has a period when the excitation generating unit outputs a sine wave and a period when the unit does not output a sine wave, so that a demodulated signal is generated using both a response of the sensor system in the period when the sine wave is output and a response of the sensor system in the period when the sine wave is not output.

It is noted that although the present specification and claims recite that the excitation generating unit outputs a sine wave, the output in this case is not limited to a sine wave having a single frequency. Every signal can be represented as a series of sine waves having different frequencies (a Fourier series expansion). In other words, when the excitation generating unit outputs a square wave, for example, the square wave expresses a series of sine waves having different frequencies. In this case, a demodulated signal may be obtained by signal processing, focusing on a sine wave having a fundamental frequency of the square wave. Thus, the present invention includes even a case where the excitation generating unit outputs a square wave. From the similar reason, the present invention includes any case where the excitation generating unit outputs any alternating current.

Effects of the Invention

By implementing an electronic device, an electrostatic capacitance sensor, a touch sensor and a touch panel according to the present invention, the following six effects can be obtained.

A first effect is that since noise is acquired by stopping a sinusoidal wave, the noise can be accurately acquired regardless of the presence or absence of a finger (presence or absence of a touch).

A second effect is that since the signal processing path for "noise" acquired by stopping a sinusoidal wave is the same as the signal processing path for "true signal plus noise" acquired by providing the sinusoidal wave, the noise can be accurately acquired.

A third effect is that since a subtraction is performed between vectors of "true signal plus noise" and "noise", the true signal can be accurately obtained even when the true signal and the noise have the same frequency.

A fourth effect is that noise with frequencies close to the frequency of a true signal can be removed beyond frequency resolution by using the mean vector of forward noise (noise acquired during a stop of a sinusoidal wave before the excitation generating unit outputs the sinusoidal wave) and backward noise (noise acquired during a stop of the sinusoidal wave after the excitation generating unit has output the sinusoidal wave).

A fifth effect is that by using the mean vector of forward noise and backward noise, noise can be precisely removed even when the amplitude of the noise has changed.

A sixth effect is enabling a high S/N ratio to be obtained for various noises. In particular, applying a control means according to the present invention enables the problem of S/N ratio reduction to be avoided in an environment where an inverter circuit stops, while enabling an increase in an S/N ratio in an environment where the inverter circuit operates.

Owing to the six effects described above, the present invention enables provision of a touch panel and an electronic device that are robust to external noise and have a high signal-to-noise ratio.

MODES FOR CARRYING OUT THE INVENTION (Embodiment 1)

A electrostatic capacitance sensor of the present invention will be illustrated. The function of a typical electrostatic capacitance sensor is implemented by omitting the function of detecting a position from the functions of a touch panel illustrated in the background art section. Since the position detection function is omitted, a conductive sheet or simply a conductor may be used in place of the resistive sheet.

(Configuration)

Figure 1:
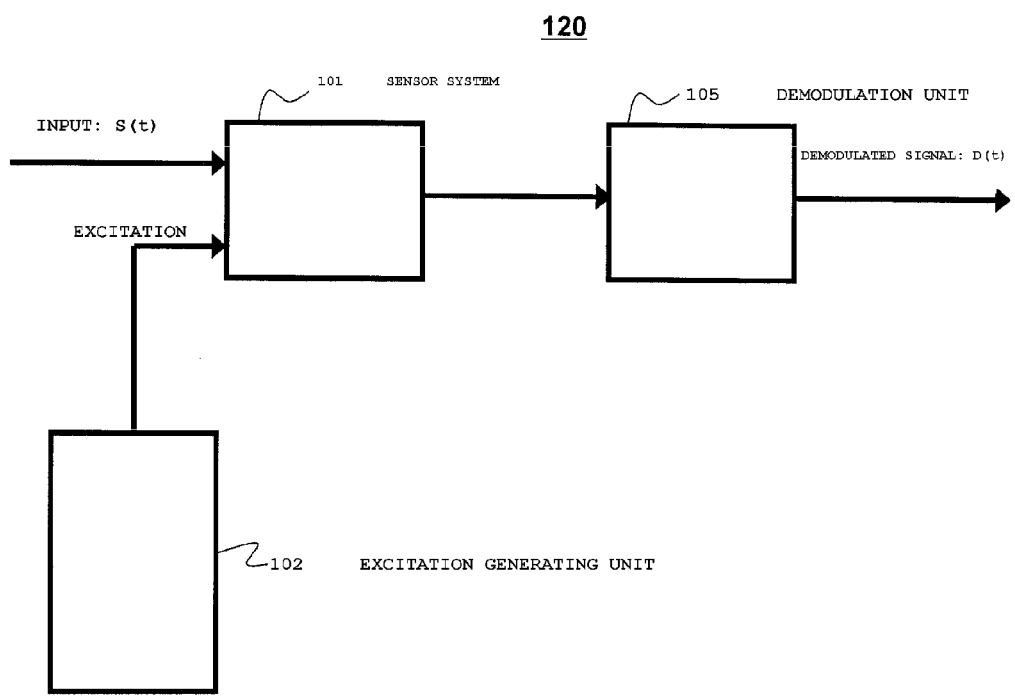
FIG. 1 is a block diagram of an electronic apparatus in Exemplary Embodiment 1 of the present invention.
Figure 2:
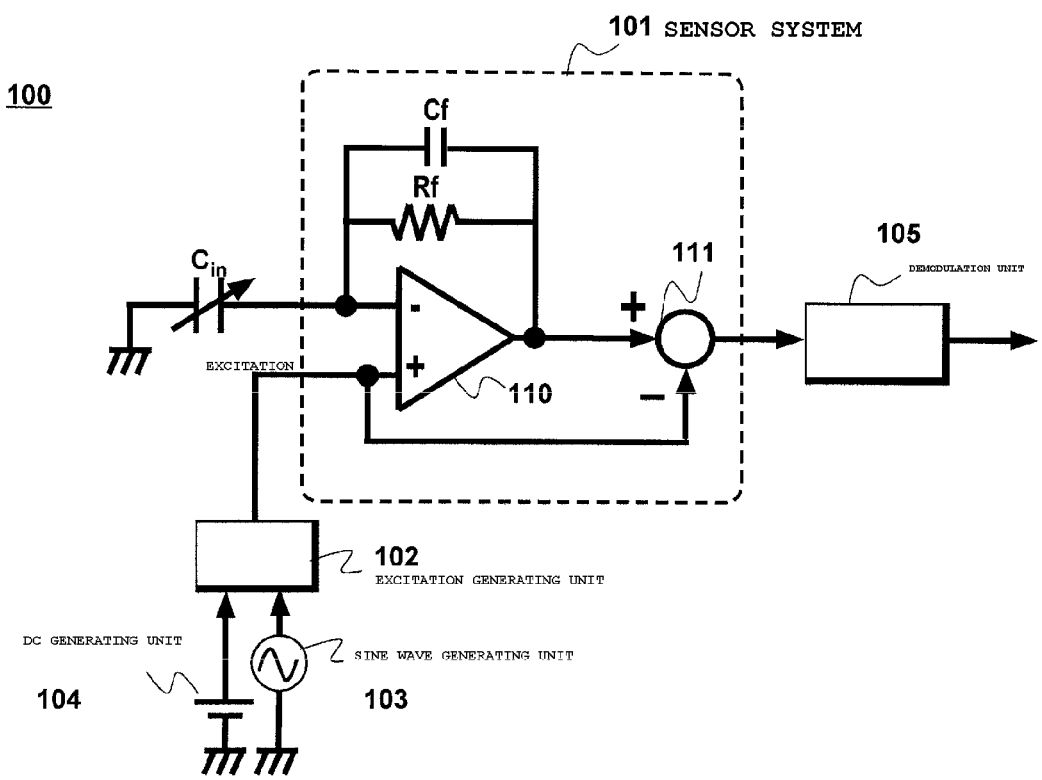
FIG. 2 is a block diagram of an electrostatic capacitance sensor in Exemplary Embodiment 1 of the present invention.

FIG. 2 is a block diagram of a electrostatic capacitance sensor 100 of the present invention and FIG. 1 is a block diagram of an electronic device 120 of the present invention which is an abstraction of the electrostatic capacitance sensor of the present invention. The electrostatic capacitance sensor 100 illustrated in FIG. 2 is configured to detect the capacitance of a capacitor $C_{in}$ depicted in the figure. The electrostatic capacitance sensor includes a sensor system 101 that takes inputs of the capacitance of the capacitor $C_{in}$ and an excitation and outputs a signal according to the capacitance of the capacitor $C_{in}$, an excitation generating unit 102 generating the excitation, a sinusoidal wave generating unit 103 connected to the excitation generating unit, and a DC generating unit 104. The output from the sensor system is input into a demodulating unit 105, which generates a demodulated signal.

The excitation generating unit generates an intermittent sinusoidal wave signal. Means for generating an intermittent sinusoidal wave signal includes the sinusoidal wave generating unit 103 and the DC generating unit 104 provided as illustrated in FIG. 2, and means for switching therebetween is provided. However, it is not limited to such means. Other means may be, for example, to use a digital-to-analog converter and provide a digital signal obtained by discretizing an intermittent sinusoidal wave to the DA converter.

The sensor system includes an operational amplifier 110, a resistance $R_f$ inserted in its feedback path, and a capacitor $C_f$ and further includes an adder 111 that performs a subtraction between an output voltage from the operational amplifier 110 and an excitation voltage.

Assuming that the operational amplifier 110 is an ideal operational amplifier and letting $V_1$ denote the voltage of excitation input into the sensor system 101 and $V_2$ denote the output voltage from the sensor system, then the frequency response $H(j\omega)$ of the sensor system can be obtained by solving a circuit equation obtained from the figure as follows:

$$H(j\omega) = \frac{V_2}{V_1} = \frac{j\omega C_{in} R_f}{1 + j\omega C_f R_f} \quad \text{[Formula 2]}$$

Here, $\omega$ represents the angular frequency of the excitation and j represents an imaginary unit.

From the equation, the amplitude response $|H(j\omega)|$ of the sensor system is $$|H(j\omega)| = \frac{\omega C_{in} R_f}{\sqrt{1 + \omega^2 C_f^2 R_f^2}} \quad \text{[Formula 3]}$$

As represented by formula 3, the amplitude of the output from the sensor system 101 is proportional to the capacitance of the capacitor $C_{in}$.

Since the frequency of the output from the sensor system is equal to the frequency of the excitation and the amplitude of the output changes in accordance with the capacitance of the capacitor $C_{in}$, the sensor system can be said to be an amplitude modulation system.

FIG. 2 can be abstracted to FIG. 1. The input S(t) into the sensor system can be a capacitance as illustrated in this embodiment as well as an electrical signal such as a voltage or a current.

(Operation)

An operation of the electrostatic capacitance sensor of the present invention will be illustrated with reference to FIG. 3.

Figure 3:
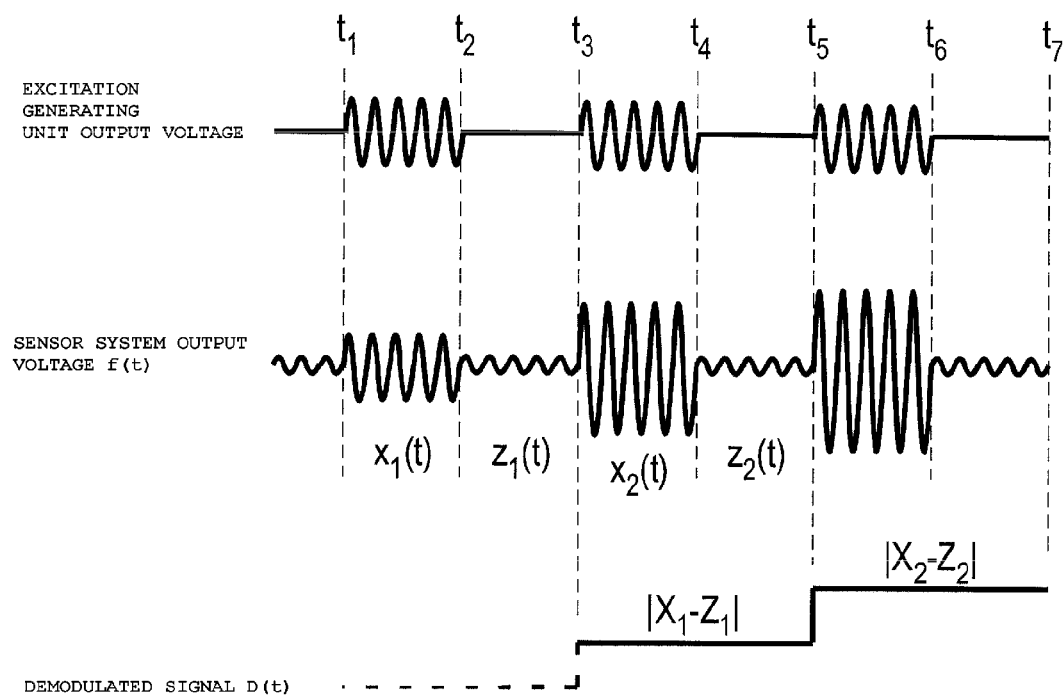
FIG. 3 is a timing chart of the electrostatic capacitance sensor in Exemplary Embodiment 1 of the present invention.

The excitation generating unit 102 generates an intermittent sinusoidal voltage as illustrated as the waveform at the top of FIG. 3, i.e. excitation generating unit output voltage. The sinusoidal voltage is provided to the sensor system 101 as an excitation. The frequency of the sinusoidal wave in this example is 100 kHz. In response to the excitation and the capacitance of the capacitor $C_{in}$, the sensor system outputs a voltage f(t) as illustrated as the second waveform in FIG. 3, i.e. a sensor system output voltage. Responses of the sensor system in periods in which the excitation generating unit 102 is outputting the sinusoidal wave are denoted as $x_1(t)$, $x_2(t)$ as in the figure and output voltages from the sensor system in periods in which the excitation generating unit stops outputting the sinusoidal wave are denoted as $z_1(t)$, $z_2(t)$.

According to formula 2, the amplitude of the output voltage from the sensor system is zero in the periods in which the excitation generating unit stops outputting the wave. In reality, however, the amplitude is not zero because of noise contamination. In many applications such as touch sensors and touch panels, the capacitance of the capacitor $C_{in}$ as illustrated in FIG. 2 is the capacitance of a capacitor formed by an indicator and a resistive sheet, and external noise (electric field variations and capacitive coupling noise) is easily coupled into the resistive sheet that constitutes a part of the capacitor $C_{in}$. The reason why $z_1(t)$ and $z_2(t)$ in FIG. 3 are not zero is that they reflect the influence of the noise. When external noise is steady, there is external noise contamination regardless of whether there is sinusoidal wave excitation or the sinusoidal wave is stopped (DC), therefore noise is present in $x_1(t)$ and $x_2(t)$. In other words, a true signal plus noise (true signal +noise) appears in $x_1(t)$ and $x_2(t)$ and only noise appears in $z_1(t)$ and $z_2(t)$.

A significant finding by the inventors is that $z_1(t)$ and $z_2(t)$ are not dependent on the capacitance of the capacitor $C_{in}$ but represents external noise. In other words, in a touch sensor or a touch panel, only noise appears regardless of the presence or absence of a finger, which is an indicator. This is because the impedance of the capacitor $C_{in}$ formed by the finger and the position sensing conductive film is sufficiently higher than the impedance of the sensor system, noise entering the position sensing conductive film is coupled into the sensor system as a current regardless of the presence or absence of a finger.

Another significant finding is that there is a correlation between noise present in the sensor system output voltage in a period during which the excitation generating unit is outputting the sinusoidal wave and noise present in the sensor system output voltages in the periods preceding and succeeding that period.

The demodulating unit 105 receives an output signal from the sensor system 101 and takes advantage of the features illustrated above to remove noise. An example will be illustrated where a true signal in $x_1(t)$, here the amplitude of a true signal in $x_1(t)$, is obtained from an observed signal $x_1(t)$ including the true signal plus noise and an observed signal $z_1(t)$ including only noise.

The demodulating unit 105 periodically reads a signal value from the sensor system output voltage f(t) at time intervals $\Delta t$ and converts the signal value into a discrete time signal $f(i\Delta t)$, where $i \in Z$ (Z is a set of integers). By sampling $x_1(t)$ in this way, $x_1(i\Delta t)$ is obtained, where i=0, 1, 2, ..., N−1, and by sampling $z_1(t)$), $z_1(i\Delta t)$ is obtained, where i=0, 1, 2, ..., Q−1.

Let $X_1$ denote the discrete Fourier transform Dk that corresponds to 100 kHz which is the frequency of the excitation sinusoidal wave among the discrete Fourier transforms Dk of $x_1(i\Delta t)$, then a complex number $X_1$ can be obtained as $$X_1 = \frac{1}{N}\sum_{i=0}^{N-1} x(i\Delta t)\exp(-j2\pi 100 \text{ kHz } i\Delta t) \quad \text{[Formula 4]}$$

where j is an imaginary unit and N is the number of samples. The complex number $X_1$ can be written as a two-dimensional vector $X_1 \equiv (\text{Re } \{X_1\}, \text{Im } \{X_1\})$, where Re $\{X_1\}$ is the real part of the complex number $X_1$ and Im $\{X_1\}$ is the imaginary part of the complex $X_1$. These are equivalent to each other.

Similarly, let $Z_1$ denote the discrete Fourier transform Dk that corresponds to 100 kHz which is the frequency of the sinusoidal wave among the discrete Fourier transforms Dk of $z_1(i\Delta t)$, then a complex number $Z_1$ can be obtained as $$Z_1 = \frac{1}{Q}\sum_{i=0}^{Q-1} z(i\Delta t)\exp(-j2\pi 100 \text{ kHz } i\Delta t) \quad \text{[Formula 5]}$$

where j is an imaginary unit and Q is the number of samples. The complex $Z_1$ can be written as a two-dimensional vector $Z_1 \equiv (\text{Re } \{Z_1\}, \text{Im } \{Z_1\})$. These are equivalent to each other.

Assuming that the 100-kHz component of noise present in the observed signal $x_1(t)$ is the same as the 100-kHz component of the observed signal $z_1(t)$, vector $X_1$–vector $Z_1$ is then calculated. The magnitude $|X_1-Z_1|$ of the result is set as the amplitude of the true signal of $x_1(t)$ and as a demodulated signal D(t) output from the demodulating unit.

The operation of the demodulating unit illustrated above will be illustrated by using a model of an observed signal and assigning specific numerical values.

Figure 4:
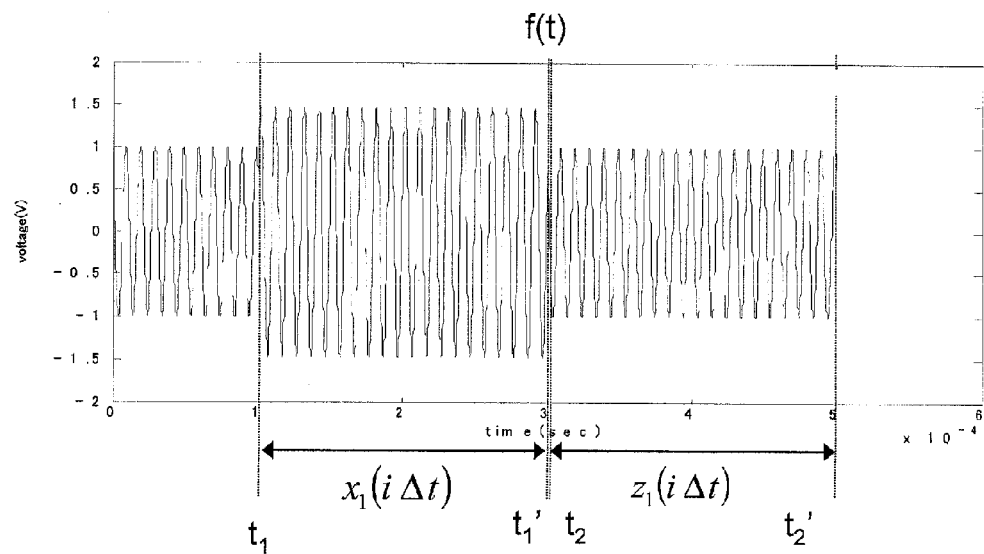
FIG. 4 is a graph of a sensor system output voltage for explaining operation of the present invention.

The model of the observed signal is illustrated in FIG. 4. Let f(t) denote the model of the observed signal, then f(t) is true signal ($V_{sig}$) with an amplitude of 2 V plus noise ($V_{noise}$) with an amplitude of 1 V, as follows:

$$f(t) = Vsig + Vnoise \quad \text{[Formula 6]}$$

$$Vsig = \begin{cases} 2\sin(2\pi 100 \text{ kt}) & (0.1 \text{ msec} < t < 0.3 \text{ msec}) \\ 0 & (\text{else}) \end{cases} \quad \text{[Formula 7]}$$

$$Vnoise = \sin\left(2\pi 100 \text{ kt} + \frac{3}{4}\pi\right) \quad \text{[Formula 8]}$$

Sampling was performed at intervals of $\Delta t=0.1$ microseconds to discretize f(t) to $f(a\Delta t)$, where a=0, 1, 2, . . . , 4999.

$x_1(i\Delta t)$ and $z_1(i\Delta t)$ are signals illustrated in FIG. 4. Considering that a 100-kHz component is to be extracted later, it is desirable that the length (time) of $x_1(i\Delta t)$, i.e. $t_1'-t_1$ be set to an integer multiple of intervals of 100 kHz, i.e. $n \times 10$ microseconds, where n is a positive integer.

Specifically, $x_1(i\Delta t)$, where i=0 to 1999, was set as $f(a\Delta t)$, where a=1000 to 2999, and $t_1'-t_1$ was set to 200 microseconds (n=20).

It is desirable that the beginning time $t_2$ of $z_1(i\Delta t)$ be set to $t_1+m \times 10$ μsec, where m is a positive integer. It is desirable that the length (time) of $z_1(t)$, i.e. $t_2'-t_2$ be set to an integer multiple of intervals of 100 kHz, i.e. $w \times 10$ microseconds, where w is a positive integer.

Specifically, $z_1(i\Delta t)$, where i=0 to 1999, was set as $f(a\Delta t)$, where a=3000 to 4999, $t_2=t_1+200$ microseconds (m=20) was set, and $t_2'-t_2$ was set to 200 microseconds (w=20).

$X_1$ and $Z_1$ were calculated to obtain the following results.

$$X_1 = \quad \text{[Formula 9]}$$
$$\frac{1}{2000}\sum_{i=0}^{1999} x(i\Delta t)\exp(-j2\pi 100 \text{ kHz } i\Delta t) = 0.3536 - j0.6464$$

$$Z_1 = \quad \text{[Formula 10]}$$
$$\frac{1}{2000}\sum_{i=0}^{1999} z(i\Delta t)\exp(-j2\pi 100 \text{ kHz } i\Delta t) = 0.3536 + j0.3536$$

Figure 5:
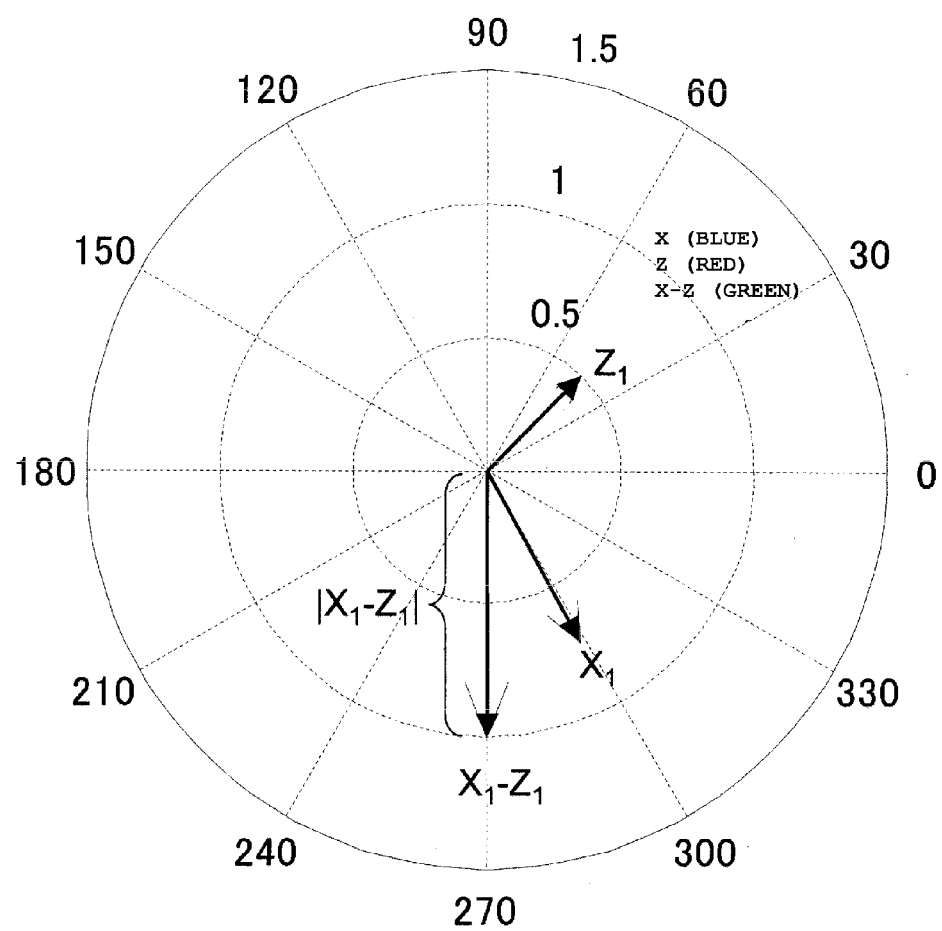
FIG. 5 is a vector diagram illustrating operation of a demodulating unit in Exemplary Embodiment 1 of the present invention.

The complex numbers given above are considered to be vectors, and vector $X_1$, vector $Z_1$, and vector $X_1$–vector $Z_1$ are plotted on a complex plane as in FIG. 5.

The magnitude of vector $X_1$–vector $Z_1$ is 1.0 as in the figure. By focusing attention on the fact that the magnitude of each vector in FIG. 5 is ½ of the amplitude of a signal of 100 kHz, the amplitude of the true signal was calculated as vector $X_1$–vector $Z_1$ equals 2 V. On the other hand, it is difficult to derive the amplitude (2 V) of the true signal based only on information such as the amplitude $2 \times |X_1|$ (1.5 V) of calculated $x_1(i\Delta t)$ and the amplitude $2 \times |Z_1|$ (1.0 V) of calculated $z_1(i\Delta t)$.

The amplitude (1.5 V) of $x_1(i\Delta t)$ and the amplitude (1.0 V) of $z_1(i\Delta t)$ are equivalent to calculated amplitudes of 100-kHz components of signals $x_1(i\Delta t)$ and $z_1(i\Delta t)$, respectively. In other words, conventional noise removal using frequency separation alone may not obtain the amplitude of the true signal.

In the foregoing, an example has been given in which $X_1$ and $Z_1$ are calculated from $x_1(i\Delta t)$ and $z_1(i\Delta t)$ and $|X_1-Z_1|$ is calculated to obtain one value of the demodulated signal D(t). For the next value of D(t), $X_2$ and $Z_2$ are calculated from $x_2(t)$ and $z_2(t)$ and $|X_2-Z_2|$ is calculated as illustrated in FIG. 3. For the subsequent values of D(t), calculations are performed in a similar manner to obtain a demodulated signal D(t).

The embodiment has two effects. The first effect is that since noise is acquired while a sinusoidal wave is stopped, noise can be accurately acquired regardless of the presence or absence of a finger or even when a finger has been placed on or removed from the panel or the pressure applied by a finger has varied to change the capacitance of the capacitor $C_{in}$.

The second effect is that since a subtraction is performed between vectors of "true signal plus noise" and "noise", the true signal can be accurately obtained even when the true signal and the noise have the same frequency.

(Embodiment 2)

In the embodiment 1, an observed signal $z_1(i\Delta t)$ was used to obtain the amplitude of the true signal of an observed signal $x_1(i\Delta t)$. In other words, noise $z_1(i\Delta t)$ observed after an observed signal $x_1(i\Delta t)$ was used to remove noise. In the embodiment 2, a mode in which noise before and after an observed signal $x_1(i\Delta t)$ is used to obtain the amplitude of a true signal of the observed signal $x_1(i\Delta t)$ will be illustrated with the focus on an operation of a demodulating unit.

Figure 6:
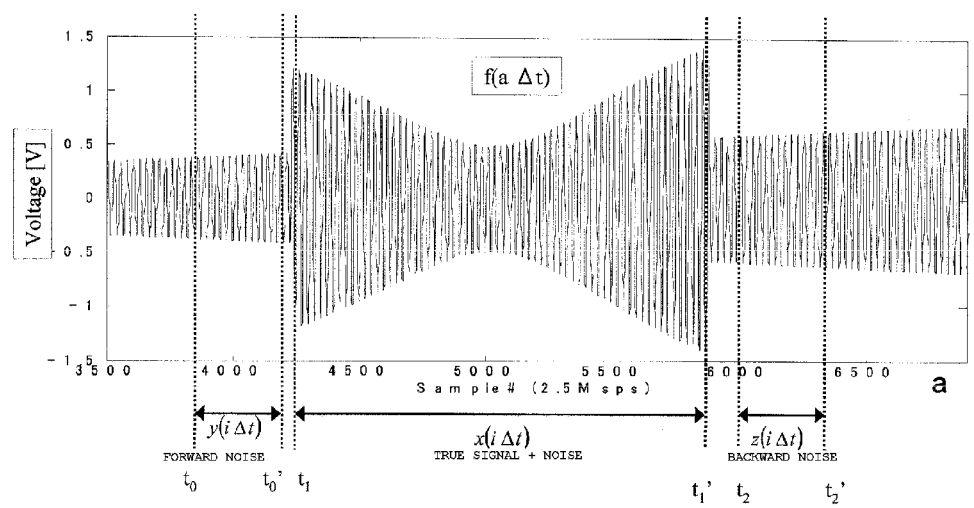
FIG. 6 is a diagram illustrating a demodulating unit input voltage for explaining operation in Exemplary Embodiment 2 of the present invention.

FIG. 6 illustrates a model $f(a\Delta t)$ of an observed signal obtained by discretizing a signal input in the demodulating unit 105, where a=0, 1, 2, . . . , and $\Delta t$=0.4 microseconds.

f(aΔt) is a true signal ($V_{sig}$) with an amplitude of 1 V plus noise ($V_{noise}$) of 99 kHz whose amplitude changes with time. This can be mathematically written as follows:

$$f(a\Delta t) = Vsig + Vnoise \quad \text{[Formula 11]}$$

$$Vsig = \begin{cases} \sin(2\pi 100\, ka\Delta t) & (4229 < a < 5879) \\ 0 & (\text{else}) \end{cases} \quad \text{[Formula 12]}$$

$$Vnoise = \frac{a\Delta t}{4 \times 10^{-3}} \sin(2\pi 99\, ka\Delta t + \pi) \quad \text{[Formula 13]}$$

where y(iΔt), x(iΔt) and z(iΔt) are signals extracted, respectively, from f(aΔt) as follows.

y(iΔt), where i=0 to 399 was set as f(aΔt), where a=3800 to 4199; x(iΔt), where i=0 to 1624, was set as f(aΔt), where a=4250 to 5874; and z(iΔt), where i=0 to 299, was set as f(aΔt), where a=6000 to 6299.

For convenience, y(iΔt) is herein referred to as forward noise and z(iΔt) is referred to as backward noise.

In the demodulating unit, the same method as that in the embodiment 1 is used to obtain complex numbers $Y_m$ and $Z_m$ from observed signals y(iΔt) and z(iΔt) according to the following formulas.

$$Y_m = \frac{1}{400} \sum_{i=0}^{399} y(i\Delta t)\exp(-j2\pi 100\, \text{kHz}\, i\Delta t) \quad \text{[Formula 14]}$$

$$Z_m = \frac{1}{300} \sum_{i=0}^{299} z(i\Delta t)\exp(-j2\pi 100\, \text{kHz}\, i\Delta t) \quad \text{[Formula 15]}$$

Here, Δt is the sampling interval and j is an imaginary unit.

Figure 7:
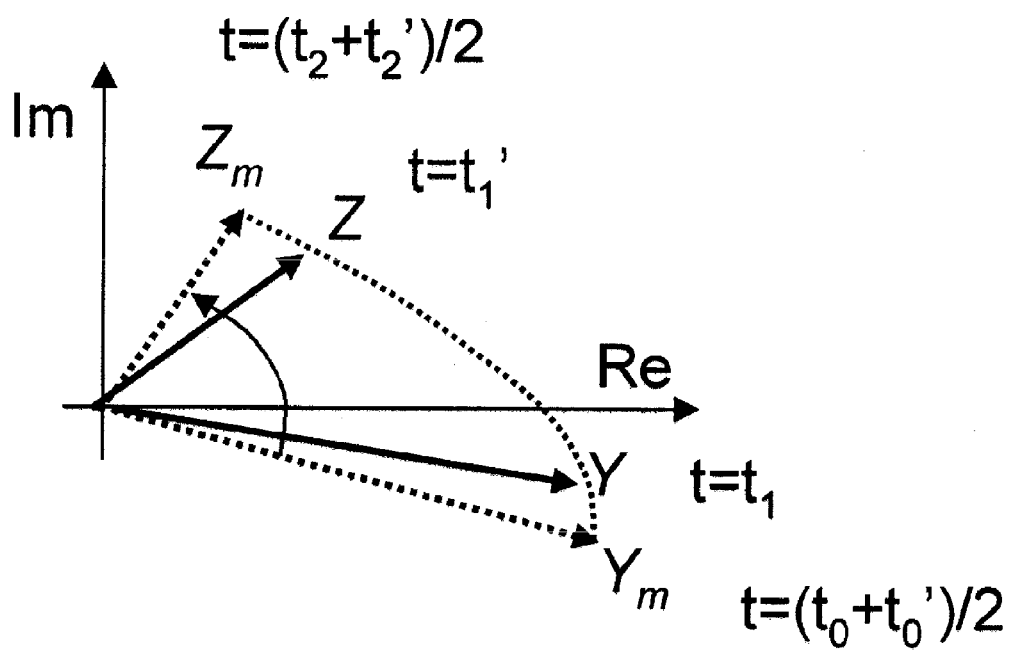
FIG. 7 is a vector diagram for explaining a demodulating unit in Exemplary Embodiment 2 of the present invention.

The vectors $Y_m$ and $Z_m$ obtained here are schematically illustrated in FIG. 7.

From the vectors $Y_m$ and $Z_m$, noise vectors Y and Z at time instants $t_1$ and $t_{1'}$ are then estimated. The estimation method is as follows. Let $Y_m$ be the noise vector at time instant $(t_0+t_{0'})/2$ and $Z_m$ be the noise vector at time instant $(t_2+t_{2'})/2$.

Approximation is made that the amplitudes and phases of the vectors change from $Y_m$ to $Z_m$ with time, and the noise vectors Y and Z at time instants $t_1$ and $t_{1'}$ are obtained. FIG. 7 schematically illustrates the relationship between $Y_m$, $Z_m$ and Y, Z.

Figure 8:
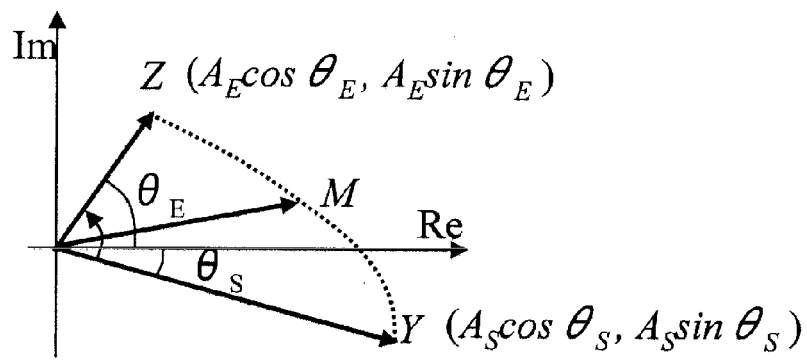
FIG. 8 is a vector diagram for explaining the demodulating unit in Exemplary Embodiment 2 of the present invention.

Then, from the vectors Y and Z, the mean vector M of the vectors Y and Z is calculated. The calculation of the mean vector will be illustrated with reference to FIG. 8.

As mentioned earlier, the vector representation and the complex representation are equivalent to each other. The formula for calculating M can be written in complex representation as follows:

$$M = \frac{1}{T}\int_0^T \left(A_S - \frac{A_S - A_E}{T}t\right)\cos\left(\theta_S - \frac{\theta_S - \theta_E}{T}t\right)dt + \\ j\left\{\frac{1}{T}\int_0^T \left(A_S - \frac{A_S - A_E}{T}t\right)\sin\left(\theta_S - \frac{\theta_S - \theta_E}{T}t\right)dt\right\} \quad \text{[Formula 16]}$$

Figure 9:
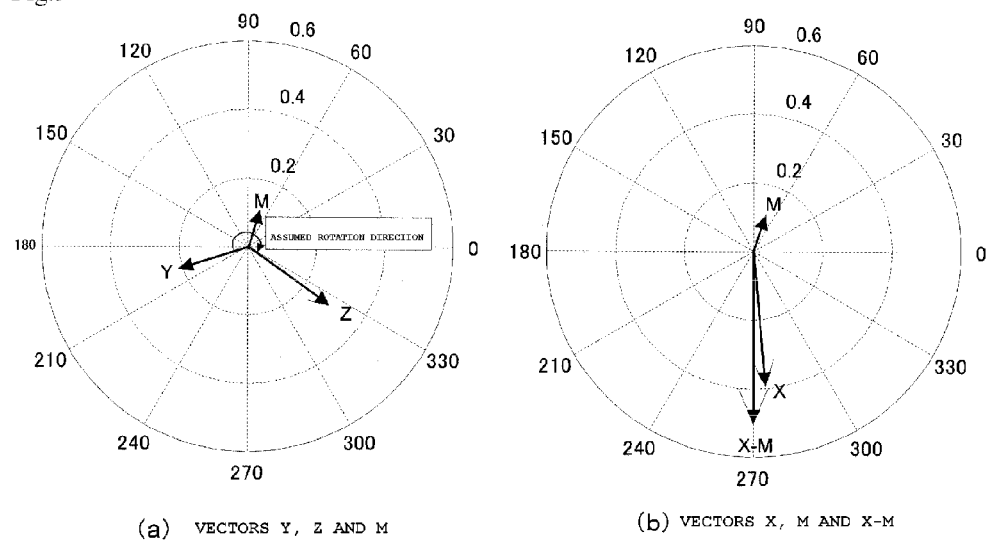
FIG. 9 is a vector diagram for explaining the demodulating unit in Exemplary Embodiment 2 of the present invention.

Here, T represents $t_{1'}-t_1$ in FIG. 6, $A_s$ and $\theta_s$ represent the amplitude and phase of the vector Y, respectively, and $A_E$ and $\theta_E$ represent the amplitude and phase of the vector Z, respectively. FIG. 9(a) illustrates Y, Z and M obtained from the model signal in FIG. 6 according to the foregoing.

Then, X is obtained in the same way as in the embodiment 1 and X–M is calculated. X can be written as follows:

$$X = \frac{1}{1625} \sum_{i=0}^{1624} x(i\Delta t)\exp(-j2\pi 100\, \text{kHz}\, i\Delta t) \quad \text{[Formula 17]}$$

Here, Δt is the sampling interval and j is an imaginary unit.

FIG. 9(b) illustrates X obtained from x(iΔt) in FIG. 6, and M and X–M obtained earlier.

From FIG. 9(b), |X–M| is 0.5, and taking note of the fact that this value is ½ of the amplitude of the true signal, it has been confirmed that the amplitude of the true signal, 1.0 V can be correctly obtained. In other words, it has been shown that if noise of 99 kHz, which is very close to the excitation frequency, 100 kHz, is present, the noise can be precisely removed.

Generally, when the signal acquisition periods are limited as in the case of x(iΔt), frequency resolution is reduced and noise close to the frequency of a true signal may not be removed. In this embodiment, on the other hand, noise close to the frequency of a true signal can be removed beyond frequency resolution by using noise y(iΔt) preceding to x(iΔt) and noise z(iΔt) succeeding to x(iΔt) as illustrated.

Further, as illustrated in this embodiment, the mean vector M can be used to precisely remove noise even when the amplitude of the noise is dependent on time.

(Effects)

The embodiment has the following two effects.

First, by using the mean vector calculated from forward noise and backward noise, noise close to the frequency of a true signal can be removed beyond frequency resolution.

Second, by using the mean vector calculated from forward noise and backward noise, noise can be precisely removed even when the amplitude of noise has changed.

(Embodiment 3)

Embodiment 3 is an embodiment of application of the present invention to an electrostatic capacitance sensor.

(Structure)

Figure 10:
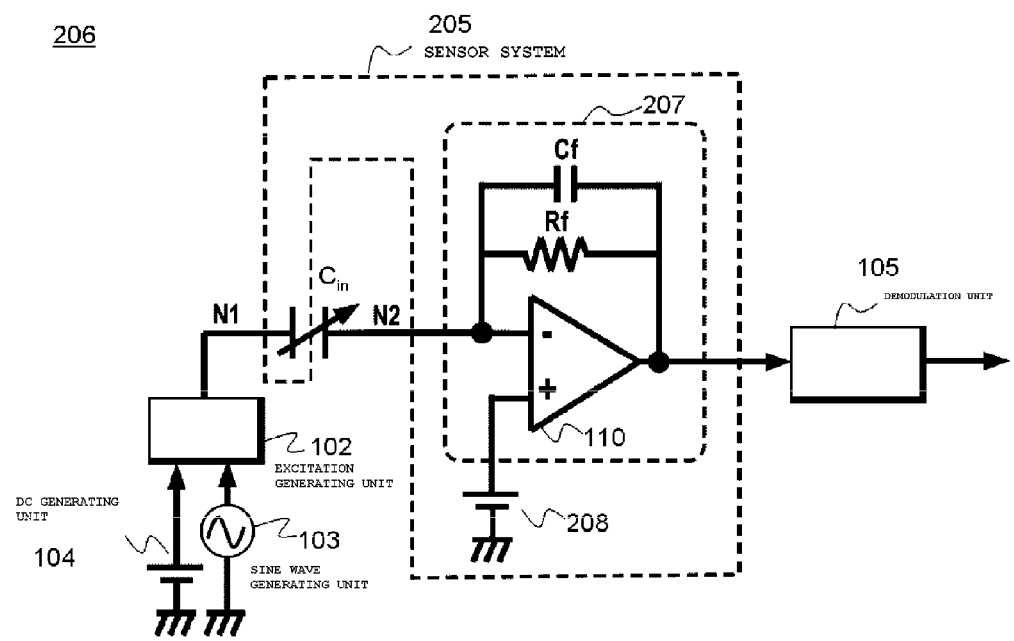
FIG. 10 is a block diagram of an electrostatic capacitance sensor in Exemplary Embodiment 3 of the present invention.

FIG. 10 illustrates a block diagram of an electrostatic capacitance sensor 206 of the present invention. The electrostatic capacitance sensor 206 illustrated in FIG. 10 is configured to detect an electrostatic capacitance of the capacitor $C_{in}$ illustrated in FIG. 10. The electrostatic capacitance sensor 206 has a sensor system 205 which outputs a signal according to the electrostatic capacitance of the capacitor $C_{in}$, with the electrostatic capacitance of the capacitor $C_{in}$ and an excitation as inputs, the excitation generating unit 102 which generates the excitation, the sine wave generating unit 103 connected to the excitation generating unit 102, and the DC generating unit 104. An output of the sensor system 205 is input to the demodulating unit 105, so that the demodulating unit 105 generates a demodulated signal.

The above-described electrostatic capacitance sensor in FIG. 2 is configured to detect an electrostatic capacitance of the capacitor $C_{in}$ connected to the ground. By contrast, the electrostatic capacitance sensor 206 in FIG. 10 as the present exemplary embodiment detects an electrostatic capacitance of the capacitor $C_{in}$ connected between a node N1 and a node N2. In addition, the electrostatic capacitance sensor in FIG. 10 is capable of detecting an electrostatic capacitance of the capacitor $C_{in}$ without being affected even when a parasitic capacitance is formed between the node N1 and the ground.

The excitation generating unit 102 generates an intermittent sine wave signal.

The sensor system 205 is configured with a current voltage converter (I-V converter) 207, one electrode (electrode connected to the node N1) configuring the capacitor $C_{in}$, and a DC bias circuit 208 (or a ground only) connected to the I-V converter 207.

The I-V converter 207 is configured with the operational amplifier 110, a resistor $R_f$ inserted in a feedback path, and the capacitor $C_f$ inserted in the feedback path, in which other electrode (electrode connected to the node N2) configuring the capacitor $C_{in}$ is connected to an inverting input terminal of the operational amplifier 110.

Assuming the operational amplifier 110 as an ideal operational amplifier, and setting a voltage of an excitation input to the sensor system 205 as $V_1$ and an output voltage of the sensor system 205 as $V_2$, the frequency response $H(j\omega)$ of the sensor system 205 becomes the same as that represented by [Formula 2] by solving a circuit formula obtained from FIG. 10. Then, the amplitude response $|H(j\omega)|$ of the sensor system becomes the same as that represented by [Formula 3]. An output amplitude of the sensor system 205 is accordingly proportional to an electrostatic capacitance of the capacitor $C_{in}$.

In addition, since the output of the sensor system 205 has its frequency coinciding with the frequency of the excitation and its amplitude varying with an electrostatic capacitance of the capacitor $C_{in}$, the sensor system 205 can be regarded as an amplitude modulation system.

(Operation)

Since input and output properties of the sensor system 205 in FIG. 10 and input and output properties of the above-described sensor system 101 in FIG. 2 are the same from the above description, operation of the present exemplary embodiment is the same as that of Exemplary Embodiment 1 or Exemplary Embodiment 2 and therefore description thereof is omitted.

Exemplary Embodiment 3 of the present invention described in the foregoing can be considered to have the following characteristics. Specifically, the electrostatic capacitance sensor 206 of the present invention has a first electrode (electrode of the capacitor $C_{in}$ on the side of the node N1 in FIG. 10), a second electrode (electrode of the capacitor $C_{in}$ on the side of the node N2 in FIG. 10), and a sensor system 205 configured with a driving circuit (corresponding to the excitation generating unit 102) which applies a voltage to the first electrode and a detecting circuit (I-V converter 207) which measures and outputs current flowing through the second electrode, in which a touching state or coordinates of an indicator are detected by detecting an electrostatic capacitance of the capacitor $C_{in}$ formed by the first electrode and the second electrode.

The electrostatic capacitance sensor 206 of the present invention includes the demodulating unit 105 which demodulates an amplitude modulated signal which is an output of the sensor system 205, and the demodulating unit 105 generates a demodulated signal using both a response of the sensor system 205 in a period when the excitation generating unit 102 outputs a sine wave and a response of the sensor system 205 in a period, at least either immediately before or immediately after the aforementioned period, when the excitation generating unit 102 does not output a sine wave.

EXAMPLES 1

An electrostatic capacitive touch panel of the present invention will be illustrated.

(Configuration)

Figure 11:
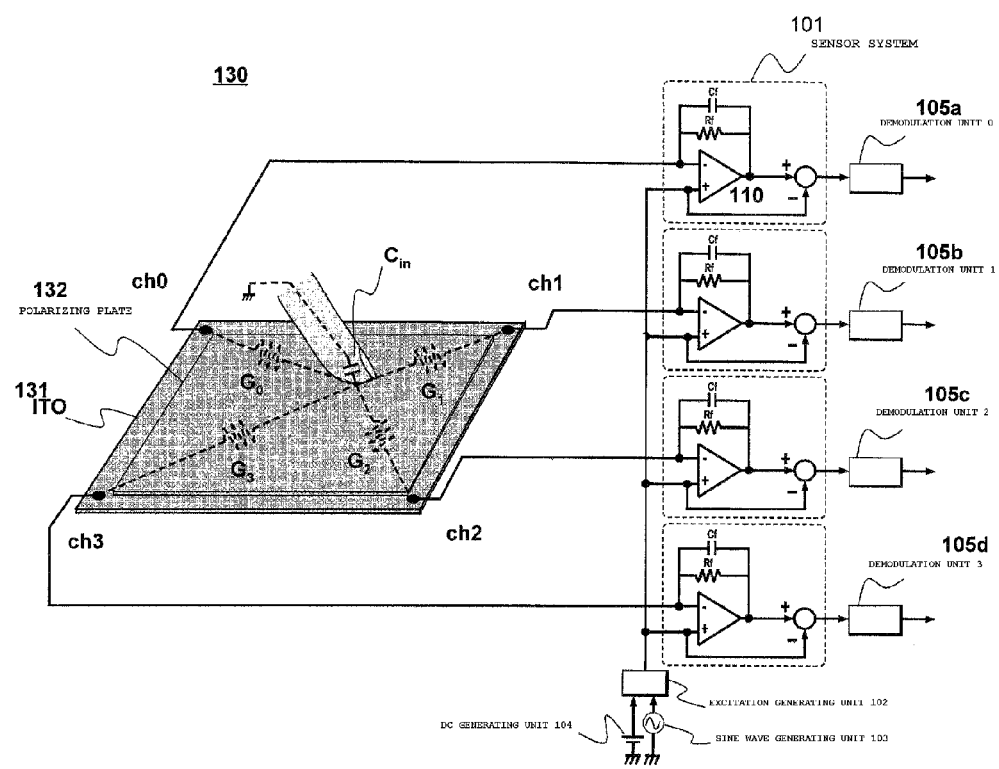
FIG. 11 is a diagram illustrating a configuration of an electrostatic capacitive touch panel in Example 1 of the present invention.

FIG. 11 illustrates a configuration of an electrostatic capacitive touch panel 130 of the present invention. The touch panel illustrated in FIG. 11 uses the capacitance of a capacitor $C_{in}$ formed between a finger and a resistive sheet 131 to detect the presence or absence of a touch and the position of the touch.

An ITO (Indium-Tin-Oxide) film is used for the resistive sheet 131. The ITO film is a solid film having a uniform sheet resistance value, 800 ohms in this example, provided on a glass substrate, not depicted. An insulator, which is a polarizer 132 used for forming a liquid-crystal display in this example, is attached on the ITO film with an acid-free adhesive.

Wiring lines are connected to the four corners of the ITO film 131. The wiring lines are connected to four sensor systems 101 as illustrated in FIG. 11. The configuration of each of the sensor systems is the same as that in the embodiment 1. Each of the four sensor systems takes an input of an output voltage from an excitation generating unit 102 and an output from each of the sensor systems is provided to an associated one of demodulating units 105 (demodulating units 0 to 3).

Outputs from the demodulating units are provided to a block, not depicted, including a signal processing circuit and the presence or absence of a touch and the position of the touch is calculated in the block including the signal processing circuit on the basis of the outputs from the demodulating units.

(Operation)

Operations of the electrostatic capacitive touch panel of the present invention will be illustrated with reference to FIG. 12.

The electrostatic capacitive touch panel of the present invention is assembled on the display surface of a liquid-crystal display (LCD) and is driven in such a manner that LCD drive noise is avoided.

Figure 12:
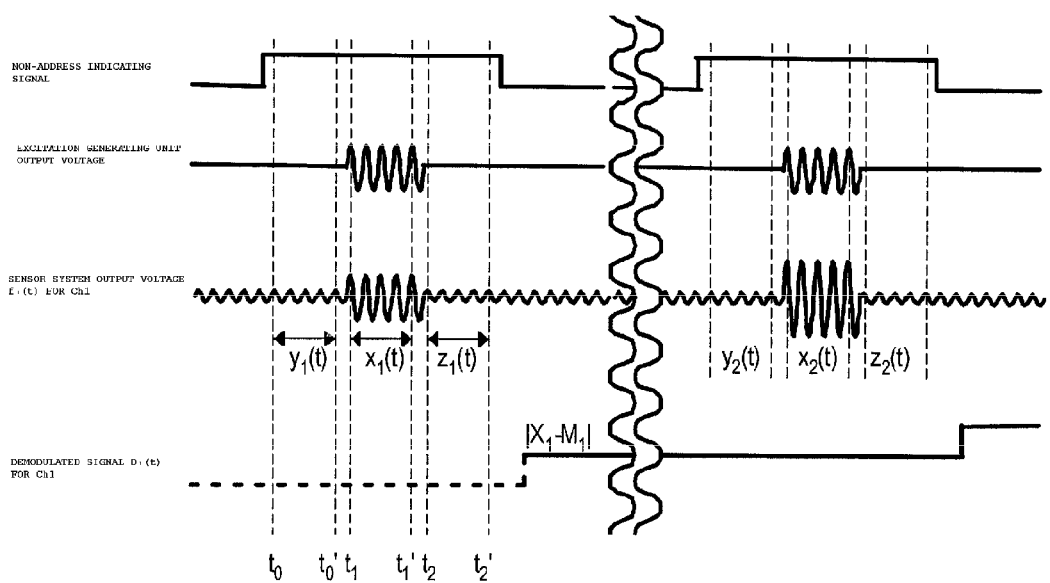
FIG. 12 is a timing chart of the electrostatic capacitive touch panel in Example 1 of the present invention.

A non-addressing indication signal in FIG. 12 is a signal that explicitly indicates a non-addressing period of the LCD and is high in a non-addressing period. The term non-addressing period herein refers to a period during which the scan lines of the LCD are not scanned and is the period from the end of selection of the last scan line to selection of the first scan line.

One of the features of the drive of the present invention is that there is a period ($t_1$ to $t_{1'}$) during which a sinusoidal wave is provided for excitation to sense a touch during a non-addressing period and there are periods ($t_0$ to $t_{0'}$, and $t_2$ to $t_{2'}$) during which the sinusoidal wave is stopped and noise is acquired.

Since noise is acquired during a non-addressing period, the noise includes external noise but does not include LCD drive noise. Consequently, noise present in a period ($t_1$ to $t_{1'}$) in which a touch is sensed can be precisely estimated and removed.

The excitation generating unit 102 generates an intermittent sinusoidal voltage as illustrated as the second waveform from the top of FIG. 12. The sinusoidal voltage is used for excitation of the sensor systems. In order to obtain the excitation generating unit output voltage in FIG. 12, the excitation generating unit is provided with a sinusoidal wave with a frequency of 100 kHz and an amplitude of 1.5 $V_{pp}$ (1.5 volts peak-to-peak) from a sinusoidal wave generating unit 103 and a DC voltage of DC=1.2 V from an DC generating unit 104. The excitation generating unit outputs an intermittent sinusoidal voltage with an offset of 1.2 V, a frequency of 100 kHz and an amplitude of 1.5 $V_{pp}$. In a period during which the sinusoidal wave is stopped, the excitation generating unit outputs a voltage of DC=1.2 V.

The voltage generated by the excitation generating unit is provided to the four sensor systems 101, which are herein referred to as the sensor system of ch0, the sensor system of ch1, the sensor system of ch2, and the sensor system of ch3 for convenience. The voltage generated by the excitation generating unit 102 is provided to a non-inverting input terminal of an operational amplifier 110 in each sensor system and the voltage appears at an inverting input terminal due to an imaginary short operation of the operational amplifier. Specifically, when the excitation generating unit 102 outputs a voltage with a frequency of 100 kHz and an amplitude of 1.5 $V_{pp}$, the voltage with a frequency 100 kHz and an amplitude of 1.5 $V_{pp}$ is applied to the ITO 131.

When the capacitance of a capacitor $C_{in}$ is formed, an AC current flows to the human body from each sensor system through corresponding conductance $G_0$ to $G_3$, which is determined according to the position of the finger, and the capacitor $C_{in}$.

An output from each sensor system is the intermittent sinusoidal voltage on which noise is superimposed and the amplitude of the output is determined by the magnitude of the AC current. The sensor system of ch1 is chosen as a representative example from among the sensor systems and the output voltage of the sensor system of ch1 is illustrated as $f_1(t)$ in FIG. 12.

An operation of the demodulating unit 105 will be illustrated by taking ch1 as an example.

The demodulating unit 105b of ch1 uses signals $y_n(t)$, $x_n(t)$ and $z_n(t)$, where n is an integer, of the output voltage $f_1(t)$ from the sensor system of ch1, as illustrated in FIG. 12, to output the amplitude $D_1(t)$ of a true signal of $x_n(t)$.

In the demodulating unit 105b, the output voltage $f_1(t)$ from the sensor system is sampled at sampling intervals $\Delta t=0.4$ microseconds to obtain $f_1(a\Delta t)$, where a is an integer sample number.

$x_1(i\Delta t)$, $y_1(i\Delta t)$, $z_1(i\Delta t)$ are signals extracted, respectively, from $f_1(a\Delta t)$ as follows: $y_1(i\Delta t)$, where i=0 to 399, was set as $f(a\Delta t)$, where a=3801 to 4200; $x_1(i\Delta t)$, where i=0 to 1624, was set as $f(a\Delta t)$, where a=4251 to 5875; and $z_1(i\Delta t)$, where i=0 to 399, was set as $f(a\Delta t)$, where a=6001 to 6400.

In this example, each of periods corresponding to $y_1(t)$ and $z_1(t)$ is divided into four segments and a vector of a 100-kHz component is calculated for each of the segments in order to accurately estimate a phase rotation of noise.

Specifically, the calculations are illustrated by formulas 18 to 25 given below.

$$Y_{1,1} = \frac{1}{100}\sum_{i=0}^{99} y\{(i)\Delta t\}\exp(-j2\pi 100 \text{ kHz } i\Delta t) \quad \text{[Formula 18]}$$

$$Y_{1,2} = \frac{1}{100}\sum_{i=0}^{99} y\{(i+100)\Delta t\}\exp(-j2\pi 100 \text{ kHz } i\Delta t) \quad \text{[Formula 19]}$$

$$Y_{1,3} = \frac{1}{100}\sum_{i=0}^{99} y\{(i+200)\Delta t\}\exp(-j2\pi 100 \text{ kHz } i\Delta t) \quad \text{[Formula 20]}$$

$$Y_{1,4} = \frac{1}{100}\sum_{i=0}^{99} y\{(i+300)\Delta t\}\exp(-j2\pi 100 \text{ kHz } i\Delta t) \quad \text{[Formula 21]}$$

$$Z_{1,1} = \frac{1}{100}\sum_{i=0}^{99} z\{(i)\Delta t\}\exp(-j2\pi 100 \text{ kHz } i\Delta t) \quad \text{[Formula 22]}$$

$$Z_{1,2} = \frac{1}{100}\sum_{i=0}^{99} z\{(i+100)\Delta t\}\exp(-j2\pi 100 \text{ kHz } i\Delta t) \quad \text{[Formula 23]}$$

$$Z_{1,3} = \frac{1}{100}\sum_{i=0}^{99} z\{(i+200)\Delta t\}\exp(-j2\pi 100 \text{ kHz } i\Delta t) \quad \text{[Formula 24]}$$

$$Z_{1,4} = \frac{1}{100}\sum_{i=0}^{99} z\{(i+300)\Delta t\}\exp(-j2\pi 100 \text{ kHz } i\Delta t) \quad \text{[Formula 25]}$$

Then, the amplitudes and phases of forward noise and backward noise are obtained.

The mean value of the amplitudes of the segments is calculated first as follows. The amplitude $|Y_m|$ of forward noise and the amplitude $|Z_m|$ of backward noise are each calculated as:

$$|Y_m|=(|Y_{1,1}|+|Y_{1,2}|+|Y_{1,3}|+|Y_{1,4}|)/4 \quad \text{[Formula 26]}$$

$$|Z_m|=(|Z_{1,1}|+|Z_{1,2}|+|Z_{1,3}|+|Z_{1,4}|)/4 \quad \text{[Formula 27]}$$

The phase of each segment is calculated from the results of the calculations of Formulas 18 to 25 as follows.

angle $[Y_{1,1}]$, angle $[Y_{1,2}]$, angle $[Y_{1,3}]$, angle $[Y_{1,4}]$, and angle $[Z_{1,1}]$ angle $[Z_{1,2}]$, angle $[Z_{1,3}]$, angle $[Z_{1,4}]$. Here, angle $[Y_{1,1}]$ represents the phase of $Y_{1,1}$.

The phases calculated above are limited within the range of $\pm\pi$. Since this is inconvenient for phase estimation, $2n\pi$, where n is an integer, is added as appropriate to smoothly link the phases.

This operation can be better understood from observation of actual shifts of phase of a 100-kHz component of a sensor system output containing external noise from an inverter circuit of a fluorescent lamp.

Figure 13:
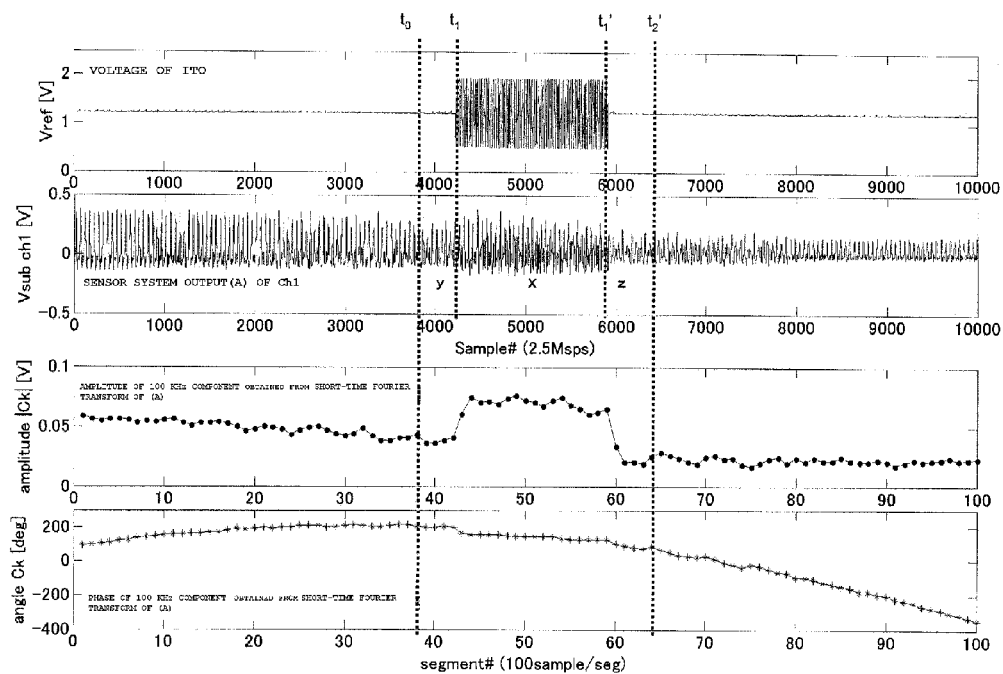
FIG. 13 is a diagram illustrating a signal waveform of the electrostatic capacitive touch panel in Example 1 of the present invention.

FIG. 13 illustrates waveforms obtained by driving an electrostatic capacitive touch panel of the present invention located near an inverter circuit of a fluorescent lamp. The chart at the top represents the voltage of the ITO, the second one from the top represents a waveform obtained by sampling a sensor system output of ch1, the third one represents the amplitude of a 100-kHz component calculated from each segment including 100 samples, and the chart at the bottom represents the phase of the 100-kHz component calculated from each segment including 100 samples. The chart at the bottom is the result of addition of $2n\pi$, where n is an integer, to the phases limited within the range of $\pm\pi$ to smoothly link the phases.

The result shows smooth phase variations and it can be seen from the result that the phases can be smoothly linked by adding $2n\pi$ as appropriate, where n is an integer.

Further, the gradients of the four phases angle $[Y_{1,1}]$, angle $[Y_{1,2}]$, angle $[Y_{1,3}]$ and angle $[Y_{1,4}]$ obtained from the forward noise and angle $[Z_{1,1}]$, angle $[Z_{1,2}]$, angle $[Z_{1,3}]$ and angle $[Z_{1,4}]$ obtained from the backward noise are used to estimate in which direction the phase has rotated during the period from the forward noise to the backward noise, and to what degree.

Let angle $[Y_{1,1}]'$, angle $[Y_{1,2}]'$, angle $[Y_{1,3}]'$, angle $[Y_{1,4}]'$ and angle $[Z_{1,1}]'$, angle $[Z_{1,2}]'$, angle $[Z_{1,3}]'$, angle $[Z_{1,4}]'$ denote phases that have undergone the two processes illustrated above, i.e. the process for removing the limitations of the range of $\pm\pi$ and the process for estimating the direction and degree of rotation from the gradients of the phases of the forward noise and the backward noise. Then the phase angle $[Y_m]$ of the forward noise and the phase angle $[Z_m]$ of the backward noise are calculated as follows.

angle[$Y_m$]=(angle[$Y_{1,1}$]'+angle[$Y_{1,2}$]'+angle[$Y_{1,3}$]'+
  angle[$Y_{1,4}$]')/4   [Formula 28]

angle[$Z_m$]=(angle[$Z_{1,1}$]'+angle[$Z_{1,2}$]'+angle[$Z_{1,3}$]'+
  angle[$Z_{1,4}$]')/4   [Formula 29]

Note that it can also be seen from the third chart from the top of FIG. 13 that the amplitude of noise present in the period x(t) can be estimated by approximation by linking the forward noise and the backward noise by straight lines.

Vector $Y_m$ is determined by $|Y_m|$ and angle [$Y_m$] obtained above and vector $Z_m$ is determined by $|Z_m|$ and angle [$Z_m$] obtained above.

Then, noise vectors Y and Z at time instants $t_1$ and $t_{1'}$ are estimated from $Y_m$ and $Z_m$ according to the procedure described in the embodiment 2.

Then, the mean vector $M_1$ of the vectors Y and Z is calculated from the vectors Y and Z according the procedure described in the embodiment 2.

Further, vector $X_1$ is obtained and $X_1-M_1$ is calculated. X can be written as the following formula.

$$X_1 = \frac{1}{1625}\sum_{i=0}^{1624} x\{i\Delta t\}\exp(-j2\pi 100 \text{ kHz } i\Delta t)$$  [Formula 30]

Here, $\Delta t$ is the sampling interval and j is an imaginary unit.

The magnitude $|X_1-M_1|$ of the vector $X_1-M_1$ is output as the output $D_1(t)$ from the demodulating unit 105b as illustrated in FIG. 12

In the next non-addressing period, $|X_2-M_2|$ is calculated similarly from $y_2(t)$, $x_2(t)$ and $z_2(t)$ and is output from the demodulating unit as illustrated in FIG. 12.

In this way, $|X_n-M_n|$ is calculated from $y_n(t)$, $x_n(t)$ and $z_n(t)$ and is output from the demodulating unit.

A block diagram of a signal processing unit for obtaining $Y_{1,1}, Y_{1,2}, Y_{1,3}, \ldots, X_1, \ldots, Z_{1,3}, Z_{1,4}$ from an output voltage $f_1(t)$ of the sensor system illustrated above will be illustrated with reference to FIG. 14.

Figure 14:
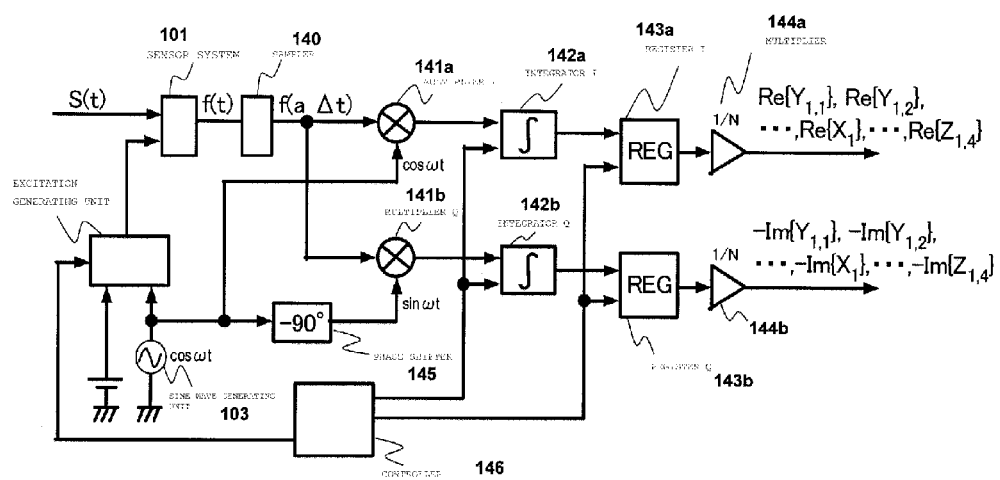
FIG. 14 is a block diagram for explaining signal processing of the electrostatic capacitive touch panel in Example 1 of the present invention.

Output f(t) of the sensor system 101 in FIG. 14 corresponds to the output voltage $f_1(t)$ of the sensor system illustrated above with reference to FIG. 11. f(t) is provided to a sampler 140, in which f(t) is converted to a discrete-time signal f(a$\Delta t$), where a=0, 1, 2, . . . , with time intervals $\Delta t$=0.4 microseconds. Then f(a$\Delta t$) is input into two multipliers (multiplier I 141a and multiplier Q 141b). The multiplier I 141a sequentially multiplies f(a$\Delta t$) by cos (ωa$\Delta t$), where a=0, 1, 2, 3, . . . and ω=2π 100 kHz, and sequentially outputs the result at time intervals $\Delta t$. Similarly, the multiplier Q 141b sequentially multiplies f(a$\Delta t$) by sin (ωa$\Delta t$), where a=0, 1, 2, 3, . . . and ω=2π 100 kHz and sequentially outputs the result at time intervals $\Delta t$.

An output of a sinusoidal wave generating unit 103 is used as cos (ωa$\Delta t$) in the multiplier I; a signal obtained by converting the output from the sinusoidal generating unit by passing through a −90-degree phase-shifter 145 is used as sin (ωa$\Delta t$) in the multiplier Q.

The outputs from the multipliers I 141a and Q 141b are input into integrators I 142a and Q 142b, respectively, and the integrators add a signal input in a period during which a control signal provided from a controller 146 is active.

For example, to obtain Y1, 1, the controller provides an active signal to the integrators in a period during which the value of a in f(a$\Delta t$) is 3801 to 3900. This causes the integrator I 142a to calculate $$\sum_{a=3801}^{3900} f(a\Delta t)\cos(\omega a\Delta t) = \sum_{i=0}^{99} y_1(i\Delta t)\cos(\omega a\Delta t)$$  [Formula 31]

In other words, a value which is one hundred times that of the real part of $Y_{1,1}$ in formula 17 is calculated.

Signals integrated in a predetermined time period taken into a register I 143a and a register Q 14 n 3b and are multiplied by 1/N (N is the number of integrated samples) by multipliers 144 connected to the registers.

Through this process, the multiplier I 144a sequentially outputs the real parts of $Y_{1,1}, Y_{1,2}, Y_{1,3}, \ldots, X_1, \ldots, Z_{1,3}, Z_{1,4}$, i.e. the values of Re{$Y_{1,1}$}, Re{$Y_{1,2}$}, Re{$Y_{1,3}$}, . . . , Re{$X_1$}, . . . , Re{$Z_{1,3}$}, Re{$Z_{1,4}$}, and the multiplier Q 144b sequentially outputs the imaginary parts of $Y_{1,1}, Y_{1,2}, Y_{1,3}, \ldots, X_1, \ldots, Z_{1,3}, Z_{1,4}$ multiplied by −1, i.e. the values of −Im{$Y_{1,1}$}, −Im{$Y_{1,2}$}, −Im{$Y_{1,3}$}, . . . , −Im{$X_1$}, . . . −Im{$Z_{1,3}$}, −Im{$Z_{1,4}$}.

These values are sequentially input into a computer, not depicted, in which the magnitudes and phases are calculated.

Results of an experiment on noise removal using the present invention and conventional noise removal, i.e. noise removal using only frequency separation will now be described.

For the experiment, a touch panel in FIG. 11 was provided and an inverter circuit of an inverter fluorescent lamp was placed 30 cm above the touch panel. Outputs from sensor systems were observed and it was found that noise from the inverter circuit is obviously present in the outputs.

The measurement was made for approximately 10 seconds and, approximately 5 seconds after the start of the measurement, the center of the touch panel was touched with a finger. Results of the experiment are illustrated in FIG. 15.

Figure 15:
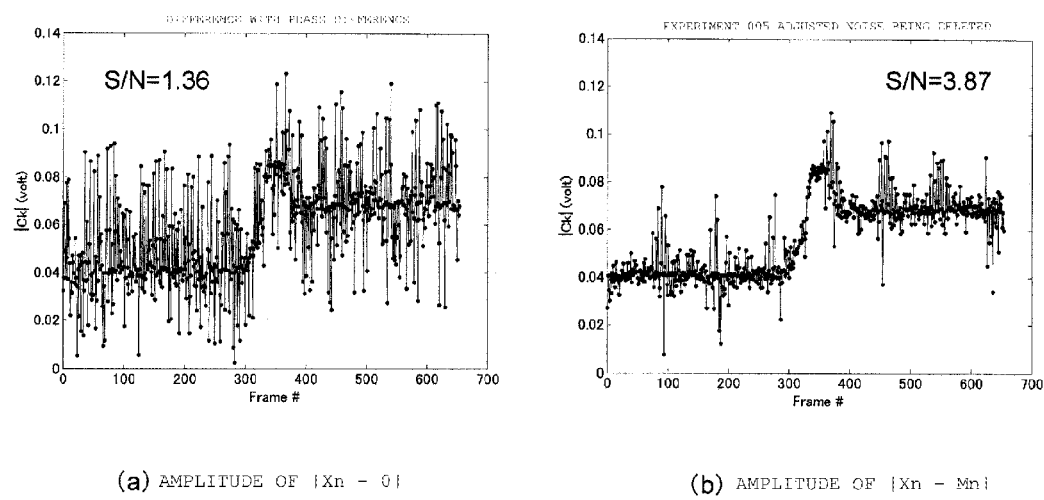
FIG. 15 is a diagram illustrating a signal waveform of the electrostatic capacitive touch panel in Example 1 of the present invention.

FIG. 15 (b) illustrates the result of the experiment with the present invention. Each of $|X_n-M_n|$, which was an output of $D_1(t)$, was plotted as one point and 653 points were linked by straight lines.

On the other hand, FIG. 15 (a) illustrates the result of the experiment on noise removal using only frequency separation. Specifically, the amplitude of a 100-kHz component of an output signal from the sensor system in a period of a sinusoidal wave with a 100 kHz excitation was obtained by $|X_n-0|$.

It has been confirmed that implementation of the present invention achieves a 9 dB improvement in signal-to-noise ratio, from conventional 1.36 to 3.87 in the present invention, where the signal S is the magnitude of signal difference between the presence and absence of a touch and the noise N is the standard deviation in the absence of a touch.

EXAMPLE 2

Example 2 is a new technique applicable to Example 1. The present Example of the present invention discloses a technique for obtaining a high S/N ratio with respect to various noises.

In Example 1, with respect to every n (n denotes a number 1, 2, 3, . . . sequentially applied to a non-address period), $|X_n-M_n|$ was calculated and an obtained value was taken as an output of the demodulating unit.

In Example 1, however, when calculation of $|X_n-M_n|$ is applied to every n, an S/N ratio might be reduced in some cases. For example, in Example 1, this is the case of a signal obtained with operation of the inverter circuit stopped. Stopping the inverter circuit removes explicit noise source to make other external noise conspicuous as noise. In the experiment in which the inverter circuit was stopped, when the output of the demodulating unit was simply set to $|X_n|$, the S/N ratio was 52.3 and when the output of the demodulating unit was set to $|X_n-M_n|$, the S/N ratio was reduced to 30.2.

As a result of analyses by the inventors, it was found that when the above-described other noise was major noise, a change in the phases obtained in Example 1, i.e. angle $[Y_{n,1}]'$, angle $[Y_{n,2}]'$, angle $[Y_{n,3}]'$ and angle $[Y_{n,4}]'$, and angle $[Z_{n,1}]'$, angle $[Z_{n,2}]'$, angle $[Z_{n,3}]'$ and angle $[Z_{n,4}]'$ (the first subscript n denotes a number 1, 2, 3, . . . sequentially applied to a non-address period and the second subscript denotes a segment number) was so large that $M_n$ calculated using them did not properly reflect noise included in $X_n$.

Figure 16:
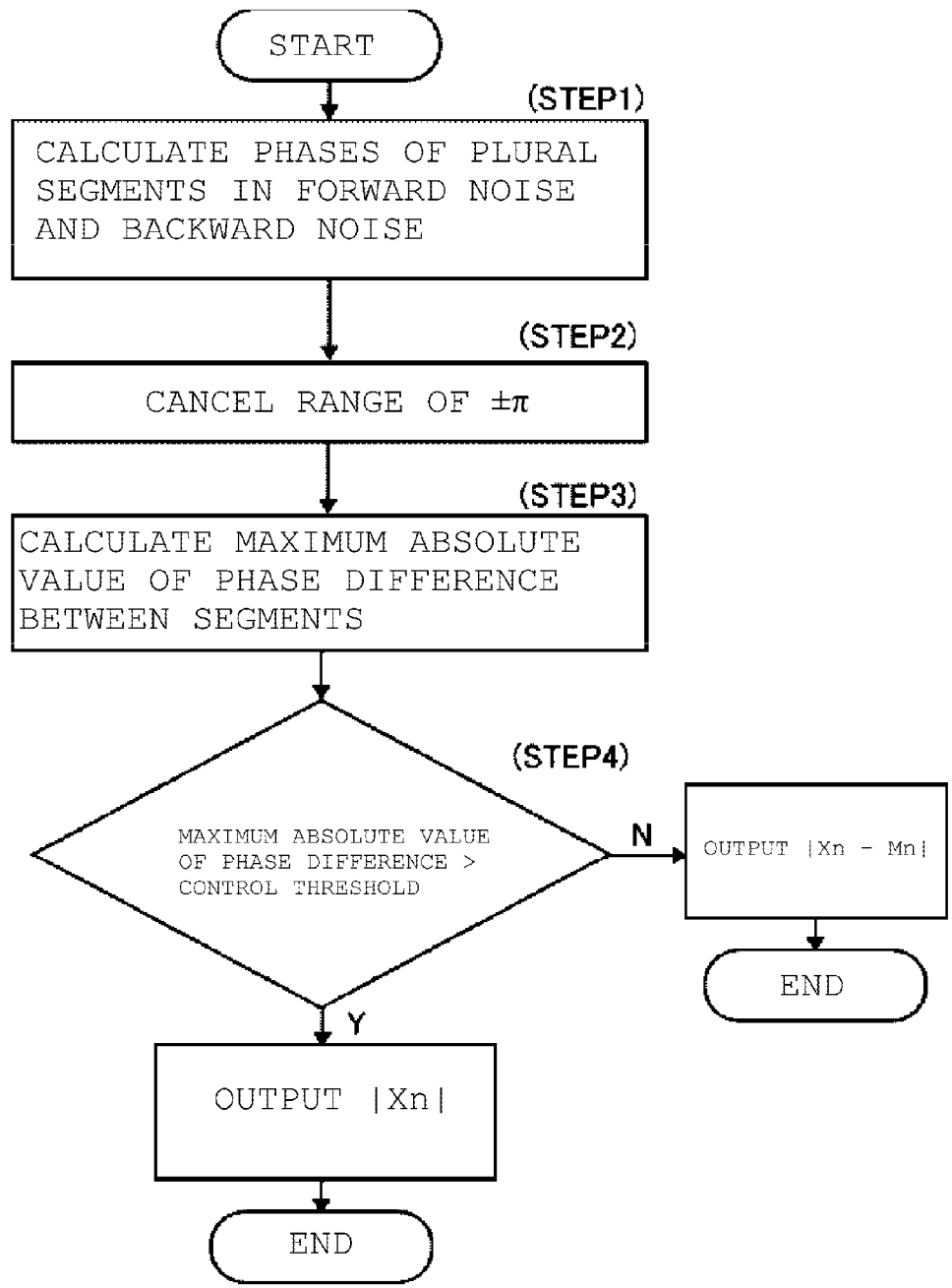
FIG. 16 is a flow chart of processing executed in a demodulating unit in Example 2 of the present invention.

Noting a phase change, a control means which sets a vector $M_n$ to zero when the phase change is larger than a predetermined value is thus added to the demodulating unit. A flow chart of processing in the demodulating unit is illustrated in FIG. 16. Operation of the demodulating unit will be described along the flow chart of FIG. 16.

(Step 1)

According to the method described in Example 1, calculation is executed of phases of four segments of the forward noise, angle $[Y_{n,1}]$, angle $[Y_{n,2}]$, angle $[Y_{n,3}]$ and angle $[Y_{n,4}]$, and phases of four segments of the backward noise, angle $[Z_{n,1}]$, angle $[Z_{n,2}]$, angle $[Z_{n,3}]$ and angle $[Z_{n,4}]$. The first subscript n denotes a number 1, 2, 3, . . . sequentially applied to a non-address period and the second subscript denotes a segment number.

Figure 17:
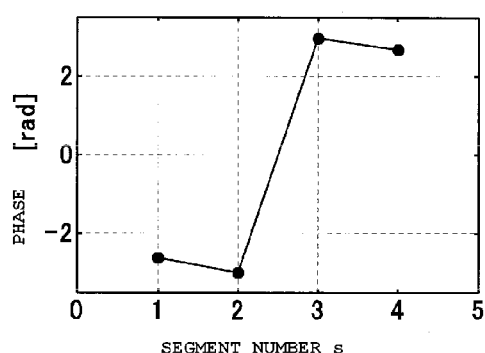
FIG. 17 is a phase graph obtained in the demodulating unit when an inverter circuit is turned ON, in which (a) represents an angle $[Y_{1,s}]$ and (b) represents an angle $[Z_{1,s}]$ in Example 2 of the present invention.
Figure 17:
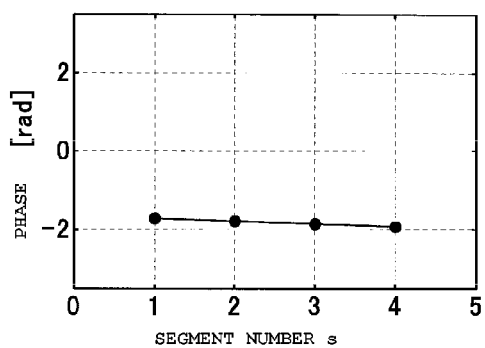
Figure 18:
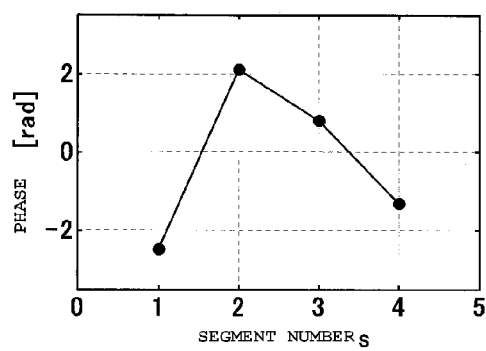
FIG. 18 is a phase graph obtained in the demodulating unit when the inverter circuit is turned OFF, in which (a) represents an angle $[Y_{1,s}]$ and (b) represents an angle $[Z_{1,s}]$ in Example 2 of the present invention.
Figure 18:
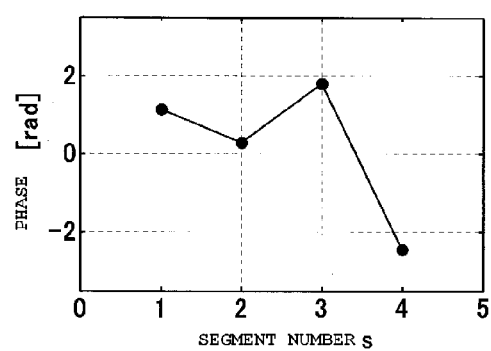

A specific example will be described. Among the values obtained by the experiment, illustrated in FIG. 17 and FIG. 18 is an example where the number n of the non-address period is 1. FIG. 17 illustrates phases, angle $[Y_{1,s}]$ and angle $[Z_{1,s}]$, obtained when the inverter circuit is operated, with s representing a segment number, and FIG. 18 illustrates phases obtained when the inverter circuit is stopped.

(Step 2)

Since the range of phases obtained at STEP 1 is from $-\pi$ to $\pi$, processing for removing the limitation is executed similarly to Example 1. In addition, from inclinations of the phases of the forward noise and the backward noise, rotation direction and amount of the phases are estimated. The phases subjected to the processing are assumed to be angle $[Y_{n,1}]'$, angle $[Y_{n,2}]'$, angle $[Y_{n,3}]'$ and angle $[Y_{n,4}]'$, and angle $[Z_{n,1}]'$, angle $[Z_{n,2}]'$, angle $[Z_{n,3}]'$ and angle $[Z_{n,4}]'$.

Figure 19:
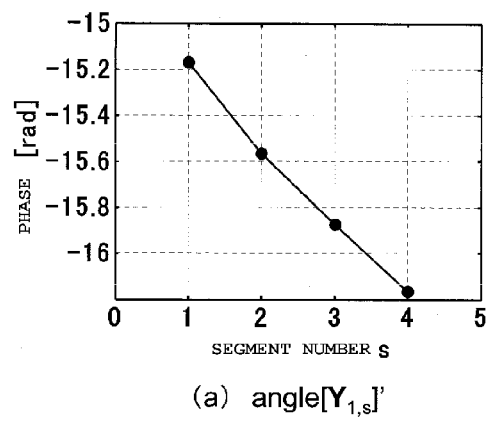
FIG. 19 is a phase graph obtained in the demodulating unit when the inverter circuit is turned ON by estimating a direction and an amount of phase rotation with respect to the graph in FIG. 17, in which (a) represents an angle $[Y_{1,s}]$ and (b) represents an angle $[Z_{1,s}]$ in Example 2 of the present invention.
Figure 19:
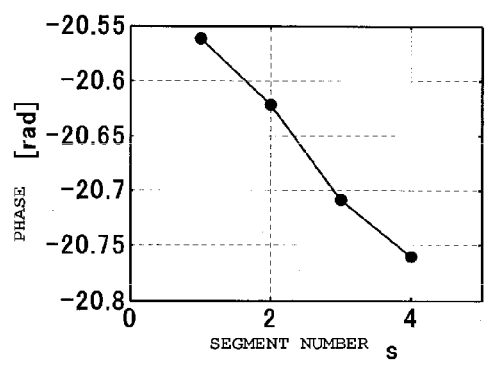
Figure 20:
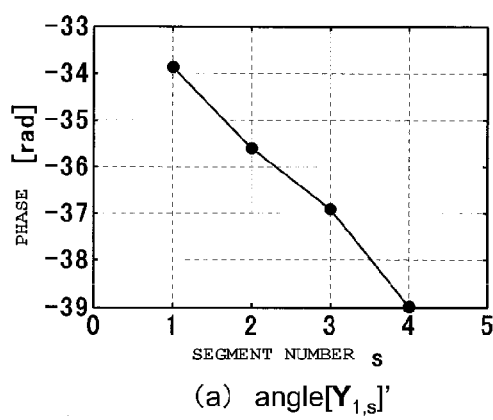
FIG. 20 is a phase graph obtained in the demodulating unit when the inverter circuit is turned OFF by estimating a direction and an amount of phase rotation with respect to the graph in FIG. 18, in which (a) represents an angle $[Y_{1,s}]$ and (b) represents an angle $[Z_{1,s}]$ in Example 2 of the present invention.
Figure 20:
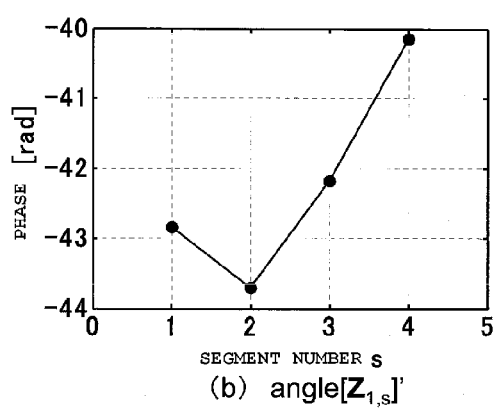

A specific example will be described. Results of the processing of STEP 2 executed with respect to the phases obtained at STEP 1 are illustrated in FIG. 19 and FIG. 20. FIG. 19 illustrates phases, angle $[Y_{1,s}]'$ and angle $[Z_{1,s}]'$, obtained when the inverter circuit is operated, with s representing a segment number, and FIG. 20 illustrates a phase obtained when the inverter is stopped.

(Step 3)

With respect to the above-obtained phases, six phase differences defined in the following are obtained.

$$dY(s)=\text{angle}[Y_{n,s+1}]'-\text{angle}[Y_{n,s}]', \ s=1, 2, 3 \quad \text{[Formula 32]}$$

$$dZ(s)=\text{angle}[Z_{n,s+1}]'-\text{angle}[Z_{n,s}]', \ s=1, 2, 3 \quad \text{[Formula 33]}$$

Next, absolute values of these six phase differences are obtained to obtain their maximum value.

Indicated in Table 1 are results of maximum absolute values of the phase differences obtained with respect to the phase data in FIG. 19 when the inverter circuit is on and with respect to the phase data in FIG. 20 when the inverter circuit is off.

TABLE 1

| inverter circuit ON | inverter circuit OFF |
|---|---|
| 0.40 (rad) | 2.11 (rad) |

(Step 4)

Using "the maximum absolute values of the phase differences" obtained at STEP 3, the output value of the demodulating unit is controlled according to the following description.

If (the maximum absolute value of the phase difference)>the control threshold, then output=$|X_n-0|$.  [Formula 34]

If (the maximum absolute value of the phase difference)≤the control threshold, then output=$|X_n-M_n|$.  [Formula 35]

In the present Example, a specific value as a control threshold was set to be 1.0 (rad). Accordingly, the output of the demodulating unit with respect to data in the non-address period whose number n is =1 is expressed as follows.

Output value of the demodulating unit=$|X_1-M_1|$ when the inverter is on.  [Formula 36]

Output value of the demodulating unit=$|X_1-0|=|X_1|$ when the inverter is off.  [Formula 37]

The above control at STEP 4 can be described as follows when using a coefficient k.

If (the maximum absolute value of the phase difference)>the control threshold, then $k=0$.  [Formula 38]

If (the maximum absolute value of the phase difference)≤the control threshold, then $k=1$.  [formula 39]

Output=$|X_n-k\cdot M_n|$.  [Formula 40]

The above-described STEP 1 to STEP 4 is applied to each number n of the non-address period. The value of the above coefficient k is determined by a large/small relation between "a control threshold" and "a maximum absolute value of a phase difference" as described above. Then, the phase difference is obtained from the forward noise and the backward noise. The forward noise and the backward noise here are outputs of the sensor system in the period when the excitation generating unit stops wave transmission. In other words, the value of k is determined using a response of the sensor system in the period when the excitation generating unit does not output a sine wave.

Figure 21:
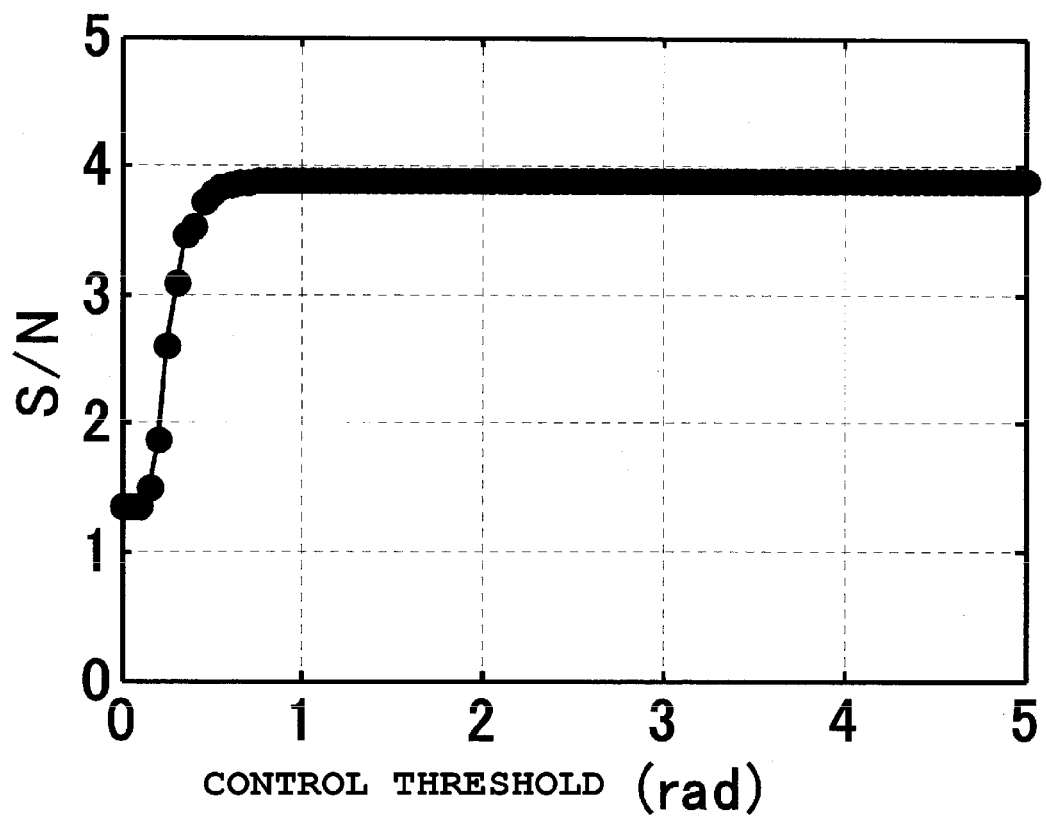
FIG. 21 is a graph illustrating an S/N ratio of an electrostatic capacitive touch panel when the inverter circuit is turned ON in Example 2 of the present invention.
Figure 22:
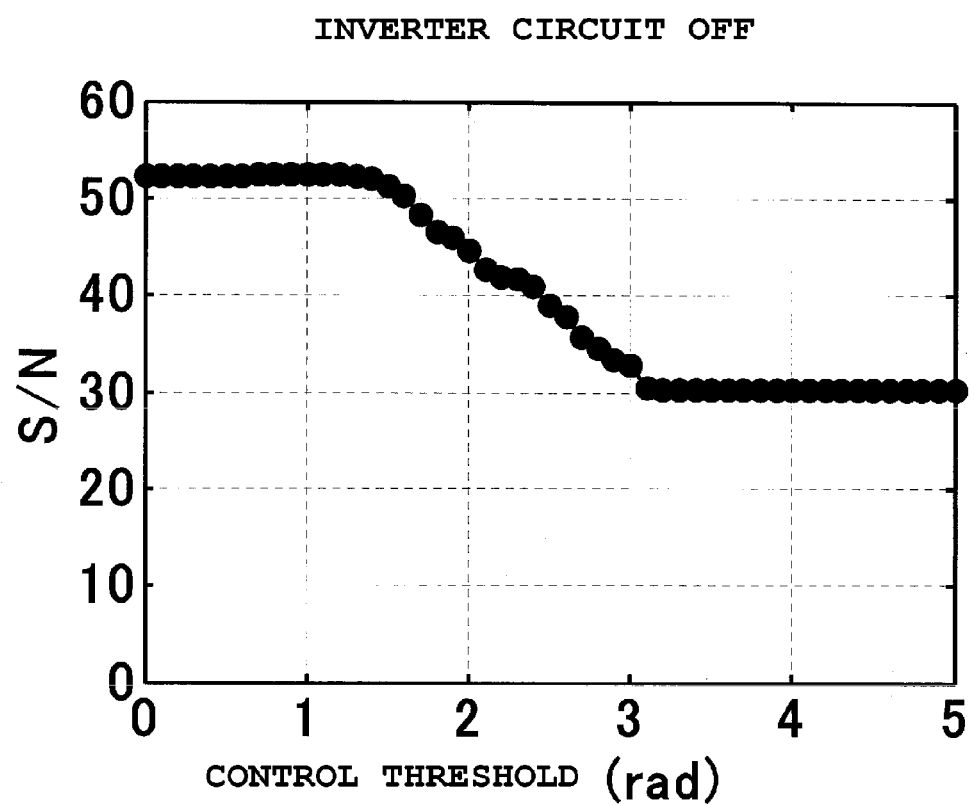
FIG. 22 is a graph illustrating an S/N ratio of the electrostatic capacitive touch panel when the inverter circuit is turned OFF in Example 2 of the present invention.

The effects of the present Example were evidenced by the following experimental results. Similarly to Example 1, the experiment has been executed by the method of driving the touch panel in FIG. 11 to evaluate an S/N ratio of an output value of the demodulating unit. How the S/N ratio changes with a value to be applied to the above control threshold was obtained by the experiment. FIG. 21 illustrates experimental results obtained in an environment in which the inverter circuit was operated. With reference to FIG. 21, it can be found that when the control threshold is set to 0.7 (rad) or above, a high S/N ratio (3.87) is obtained. When the control threshold is set to 0, the S/N ratio is reduced to 1.36. FIG. 22 illustrates experimental results obtained in an environment in which the inverter circuit was stopped. With reference to FIG. 22, it can be found that when the control threshold is set to 1.2 (rad) or below, a high S/N ratio (52.3) is obtained. Accordingly, the highest S/N ratio can be obtained both in the environment in which the inverter circuit is operated and the environment in which the inverter circuit is stopped by setting the control threshold to be 0.7 or above and 1.2 or below. In other words, applying the control means of Example 2 to Example 1 avoided the problem of reduction in an S/N ratio in the environment in which the inverter circuit was stopped, while increasing the S/N ratio in the environment in which the inverter circuit was operated.

EXAMPLE 3

Example 3 is other new technique applicable to Example 1. In Example 1, with respect to every n (n denotes a number 1, 2, 3, . . . sequentially applied to a non-address period), $|X_n-M_n|$ was calculated and an obtained value was taken as an output of the demodulating unit. On the other hand, in Example 2, a coefficient k was calculated with respect to each n and $|X_n-k\cdot M_n|$ was taken as an output of the demodulating unit. The inventors found another method for determining the coefficient k.

Figure 23:
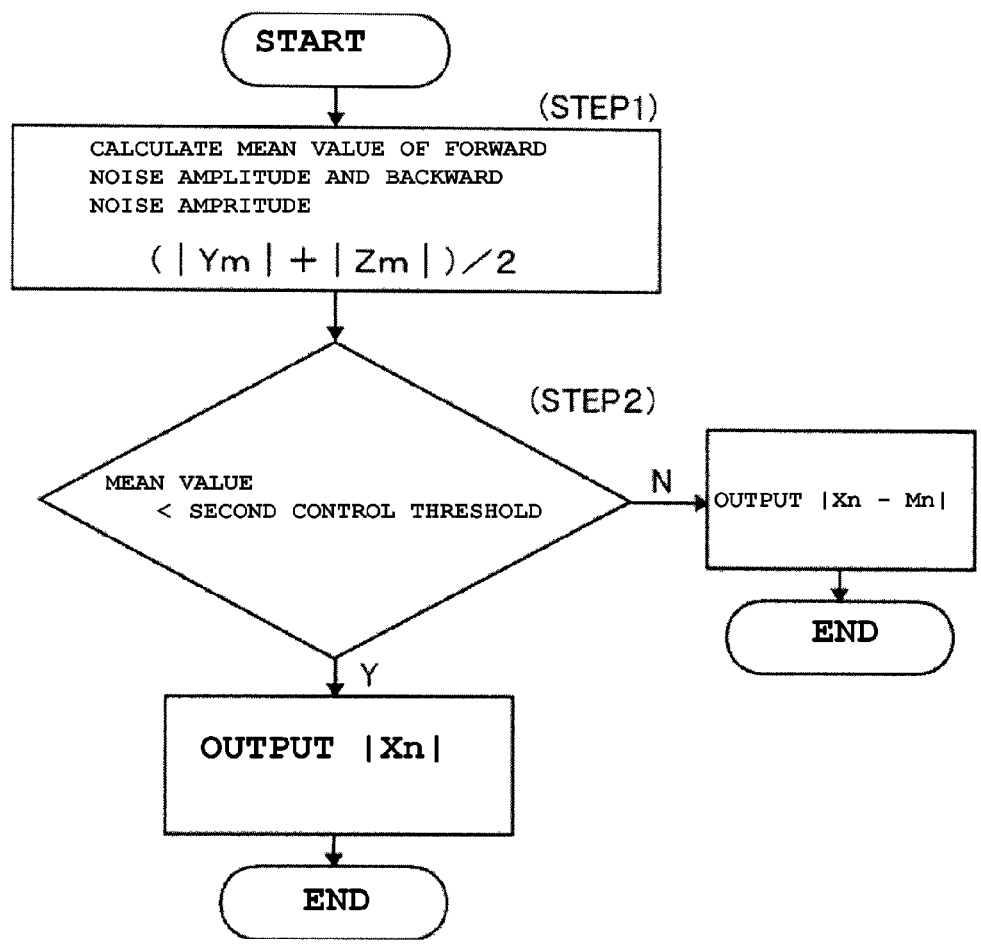
FIG. 23 is a flow chart of processing of a demodulating unit in Example 3 of the present invention.

In other words, in the present Example, an amplitude of the forward noise (noise obtained at the time of non-output of a sine wave before the excitation generating unit outputs a sine wave) and an amplitude of the backward noise (noise obtained at the time of non-output of a sine wave after the excitation generating unit outputs a sine wave) are used in order to determine a value of the coefficient k. Specifically, noting a mean value of the forward noise amplitude and the backward noise amplitude, the demodulating unit is provided with a means for setting a vector $M_n$ to zero when the mean value is larger than a predetermined value. FIG. 23 illustrates a flow chart of the processing in the demodulating unit. Operation of the demodulating unit will be described along the flow chart in FIG. 23.

(Step 1)

A mean value of the forward noise amplitude $|Y_m|$ and the backward noise amplitude $|Z_m|$ as described in Example 1 is calculated as $(|Y_m|+|Z_m|)/2$.

(Step 2)

Using "the mean value of the forward noise amplitude and the backward noise amplitude" obtained at STEP 1, the output value of the demodulating unit is controlled according to the following description.

If (the mean value of the forward noise amplitude and the backward noise amplitude)<the second control threshold, then output=$|X_n-0|$.  [Formula 41]

If (the mean value of the forward noise amplitude and the backward noise amplitude)≥the second control threshold, then output=$|X_n-M_n|$,  [Formula 42]

the output of the demodulating unit can be expressed as follows with the coefficient k.

If (the mean value of the forward noise amplitude and the backward noise amplitude)<the second control threshold, then $k=0$.

If (the mean value of the forward noise amplitude and the backward noise amplitude)≥second control threshold, then $k=1$.

Output=$|X_n-k\cdot M_n|$.  [Formula 43]

The above-described STEP 1 to STEP 2 is applied to each number n of the non-address period. The above coefficient k is determined by a large/small relation between "a second control threshold" and "a mean value of the forward noise amplitude and the backward noise amplitude" as described above. Then, the mean value is obtained from the forward noise and the backward noise. The forward noise and the backward noise here are outputs of the sensor system in the period when the excitation generating unit stops wave transmission. In other words, the value of k is determined using a response of the sensor system in the period when the excitation generating unit does not output a sine wave.

In addition, it is self-evident that the Output of [Formula 43] can express Output=$C\cdot|X_n-k\cdot M_n|$ (C is a constant) generally.

Figure 24:
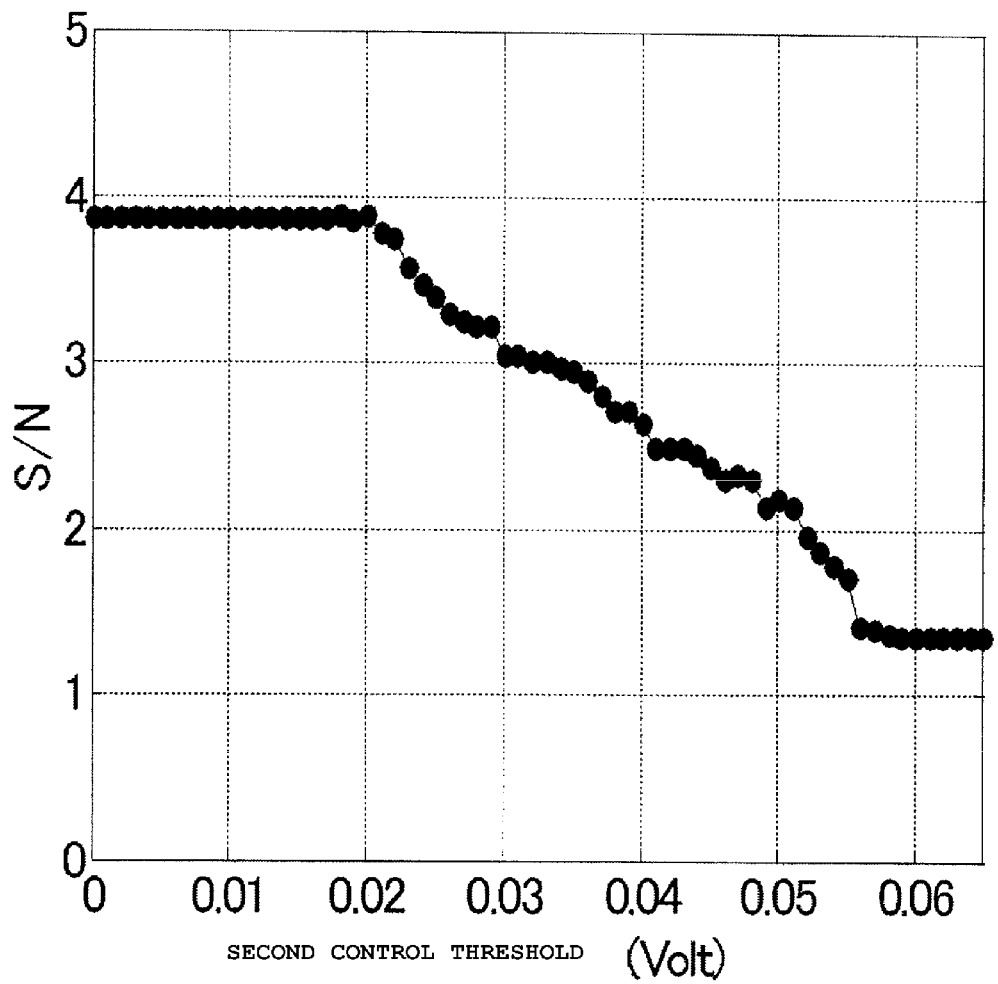
FIG. 24 is a graph illustrating an S/N ratio of an electrostatic capacitive touch panel when an inverter circuit is turned ON in Example 3 of the present invention.
Figure 25:
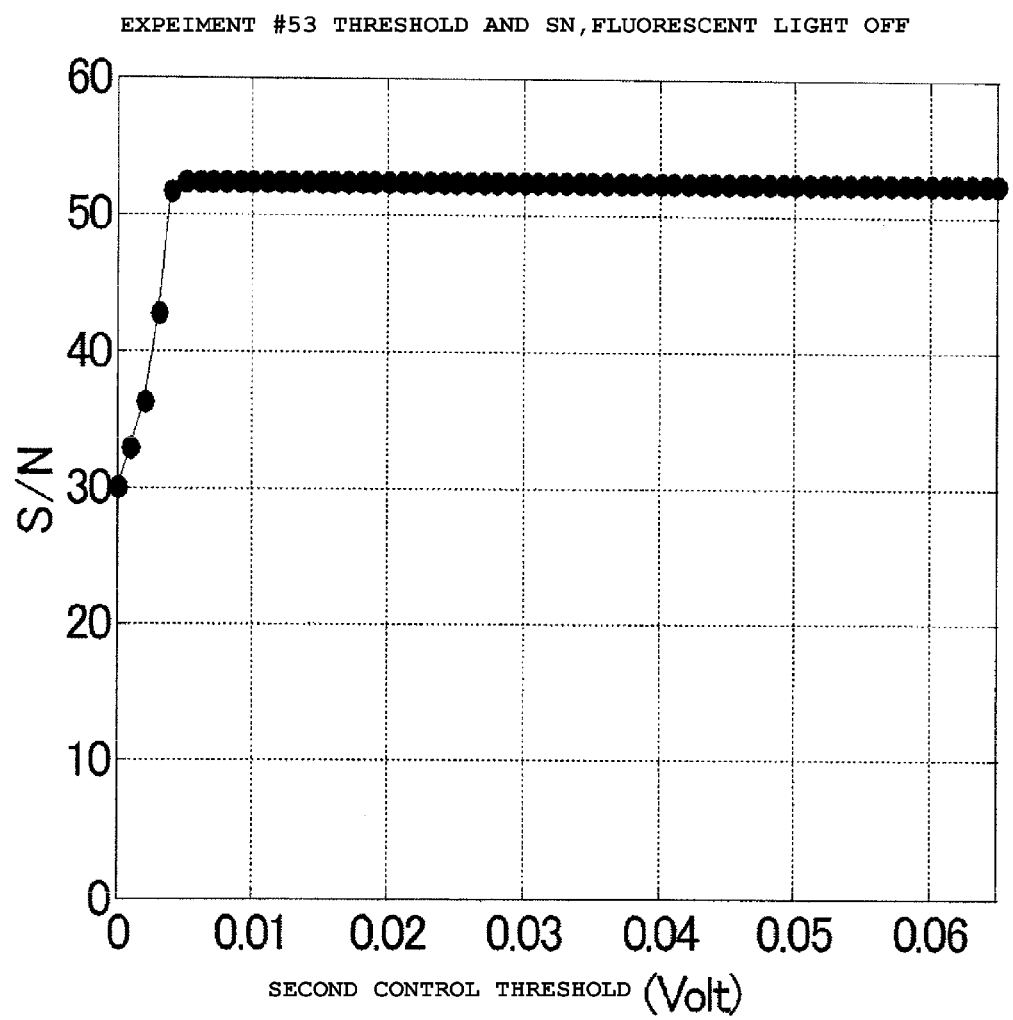
FIG. 25 is a graph illustrating an S/N ratio of the electrostatic capacitive touch panel when the inverter circuit is turned OFF in Example 3 of the present invention.

The effects of the present Example were evidenced by the following experimental results. Similarly to Example 1, the experiment has been executed by driving the touch panel in FIG. 11 to evaluate an S/N ratio of an output value of the demodulating unit. How the S/N ratio changes with a value to be applied to the above second control threshold was obtained by the experiment. FIG. 24 illustrates experimental results obtained in an environment in which the inverter circuit was operated. With reference to FIG. 24, it can be found that when the second control threshold is set to 0.02 (V) or below, a high S/N ratio (3.87) is obtained. When the second control threshold is set to 0.06, the S/N ratio is reduced to 1.36. FIG. 25 illustrates experimental results obtained in an environment in which the inverter circuit was stopped. With reference to FIG. 25, it can be found that when the second control threshold is set to 0.005 (V) or above, a high S/N ratio (52.3) is obtained. Accordingly, the highest S/N ratio can be obtained both in the environment in which the inverter circuit is operated and the environment in which the inverter circuit is stopped by setting the second control threshold to be 0.005 or above and 0.02 or below. In other words, applying the control means of Example 3 to Example 1 avoided the problem of reduction in an S/N ratio in the environment in which the inverter circuit was stopped, while increasing the S/N ratio in the environment in which the inverter circuit was operated.

The inventor tried several touch panels configured based on the recitation of Example 2 and Example 3 to evaluate S/N ratios. As a result, it was experienced that in a case of the experimental product based on Example 2, none of common control thresholds might exist with which the highest S/N ratios could be obtained both in the environment in which the inverter circuit was operated and the environment in which the inverter circuit was stopped in some cases. In such a case, replacing the demodulating unit by that recited in Example 3 resulted in having a common second control threshold with which the highest S/N ratios could be obtained both in the environment in which the inverter circuit was operated and the environment in which the inverter circuit was stopped. In other words, it can be considered that while Example 2 and Example 3 have the common effect of obtaining a high S/N ratio with respect to various noises, Example 3 might be more excellent in obtaining a high S/N ratio in some cases.

EXAMPLE 4

Figure 26:
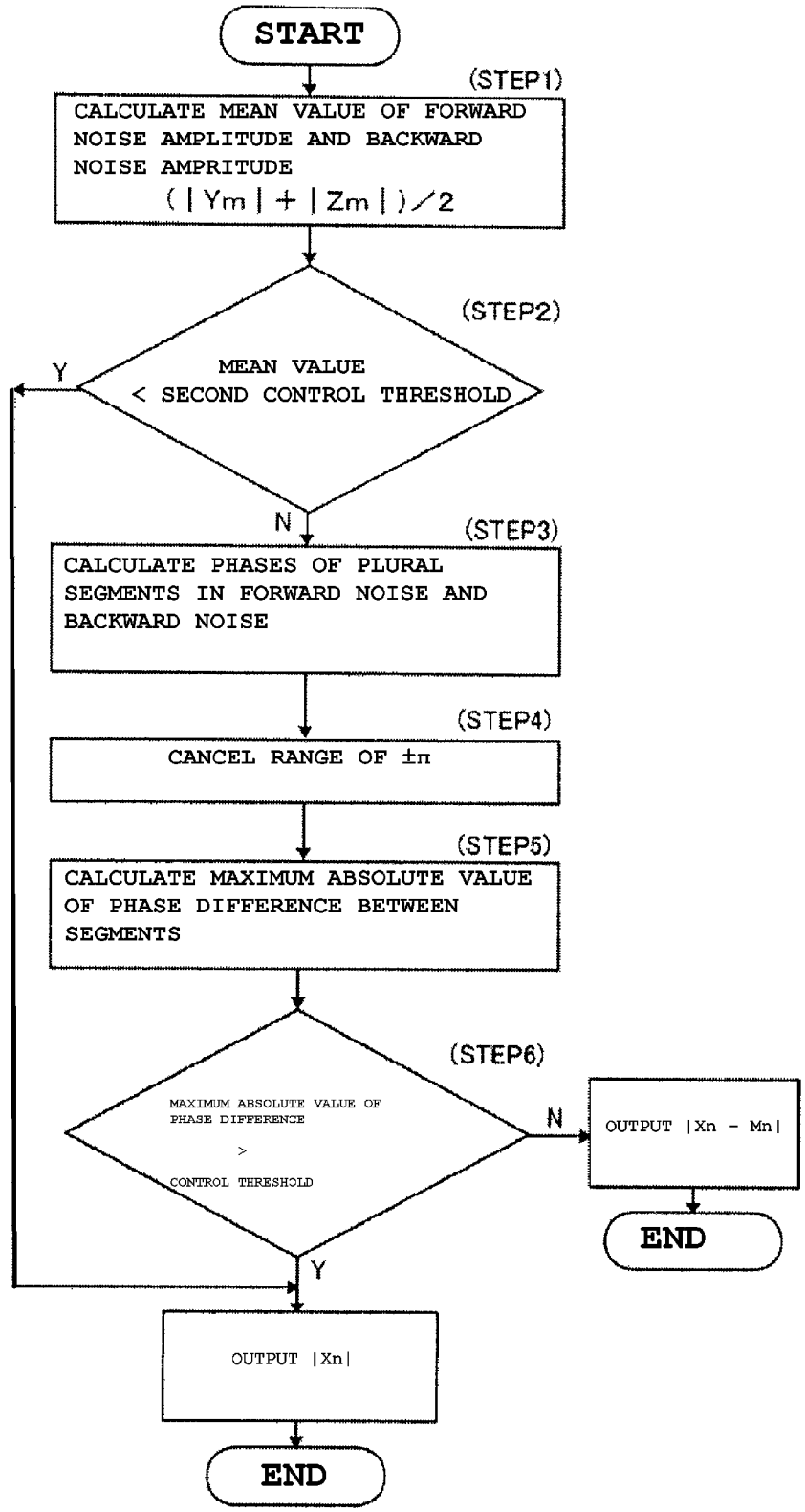
FIG. 26 is a flow chart of processing of a demodulating unit in Example 4 of the present invention.

Example 2 recites an example where the coefficient k is determined based on "a maximum absolute value of a phase difference" and Example 3 recites an example where the coefficient k is determined based on "a mean amplitude of a forward noise amplitude and a backward noise amplitude". Thus, two physical quantities are described for determining the coefficient k. Example 4 recites one example for determining the coefficient k using these two physical quantities. FIG. 26 illustrates a flow chart of processing executed in the demodulating unit. Operation of the demodulating unit will be described along the flow chart in FIG. 26.

(Step 1)

This step is the same as STEP 1 of Example 3, which is to obtain a mean value of a forward noise amplitude and a backward noise amplitude.

(Step 2)

Similarly to STEP 2 of Example 3, "a mean value of the forward noise amplitude and the backward noise amplitude" and the second control threshold are compared to find a large/small relation therebetween, and when the mean value is smaller than the second control threshold, $|X_n|$ is output to the demodulating unit to end the processing and when the mean value is not less than the second control threshold, the processing proceeds to STEP 3.

(Step 3 to Step 6)

These steps are the same as STEP 1 to STEP 4 of Example 2, in which when a maximum absolute value of a phase difference is larger than a control threshold, $|X_n|$ is output as the output of the demodulating unit to end the processing and when the maximum absolute value of the phase difference is not more than the control threshold, $|X_n-M_n|$ is output to the demodulating unit to end the processing.

The foregoing STEP 1 to STEP 6 is applied to each number n of the non-address period.

Expressing an output of the demodulating unit using the coefficient k as $|X_n-k\cdot M_n|$ leads to determination of the value of k in the present Example in the following manner. In other words, "a mean value of the forward noise amplitude and the backward noise amplitude" and a second control threshold are compared to find a large/small relation therebetween, and when the means value is smaller than the second control threshold, k is set to zero. In addition, "the mean value of the forward noise amplitude and the backward noise amplitude" and the second control threshold are compared to find a large/small relation therebetween, and when the mean value is not less than the second control threshold and a maximum absolute value of a phase difference is larger than the control threshold, k is set to zero. "The mean value of the forward noise amplitude and the backward noise amplitude" and the second control threshold are compared to find a large/small relation therebetween, and when the mean value is not less than the second control threshold and the maximum absolute value of a phase difference is not more than the control threshold, k is set to 1.

EXAMPLE 5

Other electrostatic capacitive touch panel of the present invention will be described.

(Structure)

Figure 27:
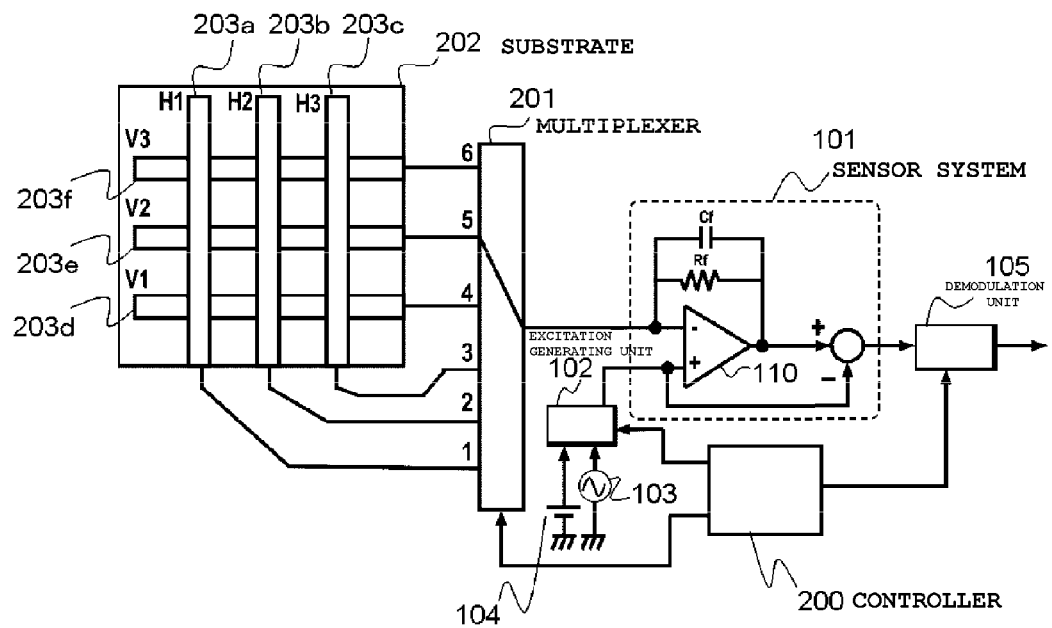
FIG. 27 is a diagram illustrating a configuration of an electrostatic capacitive touch panel in Example 5 of the present invention.

FIG. 27 illustrates an electrostatic capacitive touch panel of the present invention. The present touch panel has a transparent substrate 202 on which a plurality of electrodes (H1: 203a, H2: 203b, H3: 203c and V1: 203d, V2: 203e, V3: 203f) are disposed. The present touch panel detects touching or non-touching and a touch position by detecting an own electrostatic capacitance of an individual electrode, i.e. electrostatic capacitance formed with the ground by the individual electrode.

The respective electrodes 203a to 203f are connected to nods 1 to 6 of an analog multiplexer 201 by wiring and the analog multiplexer 201 is connected to the sensor system 101. A configuration of the sensor system is the same as that of Exemplary Embodiment 1. To the sensor system 101, an output voltage of the excitation generating unit 102 is input and an output of the sensor system 101 is applied to the demodulating unit 105.

The output of the demodulating unit 105 is transmitted to a block including a signal processing circuit not shown, so that in the block including the signal processing circuit, touching or non-touching and a touch position are calculated based on the output value of the demodulating unit 105.

The analog multiplexer 201, the excitation generating unit 102 and the demodulating unit 105 are connected to a controller 200 so as to have their operation and timing controlled.

The plurality of electrodes (H1, H2, H3 and V1, V2, V3) can be implemented in other configuration than the above-described configuration, i.e. implemented as an oblong planar electrode disposed on the substrate. They may be microwire electrodes embedded in the substrate.

While the number of electrodes is set to be 6 in the present Example, the number can be arbitrarily set, and increasing the number enables the size of the touch panel to be increased or detection precision to be improved.

(Operation)

With reference to FIG. 27, operation of the electrostatic capacitive touch panel of the present invention will be described. An analog multiplexer selection signal in FIG. 28 indicates a node number selected by the analog multiplexer 201 in FIG. 27.

One characteristic of drive of the present invention is that a period when one electrode is selected by the analog multiplexer 201 has a period ($t_1$ to $t_1'$) when a sine wave is applied to the electrode to detect touching and periods ($t_0$ to $t_0'$ and $t_2$ to $t_2'$) when noise is obtained while stopping a sine wave.

Other electrostatic capacitive touch panel of the present invention will be described. Example 6 illustrates an example of application to a mutual projected-capacitive type touch panel.

Figure 28:
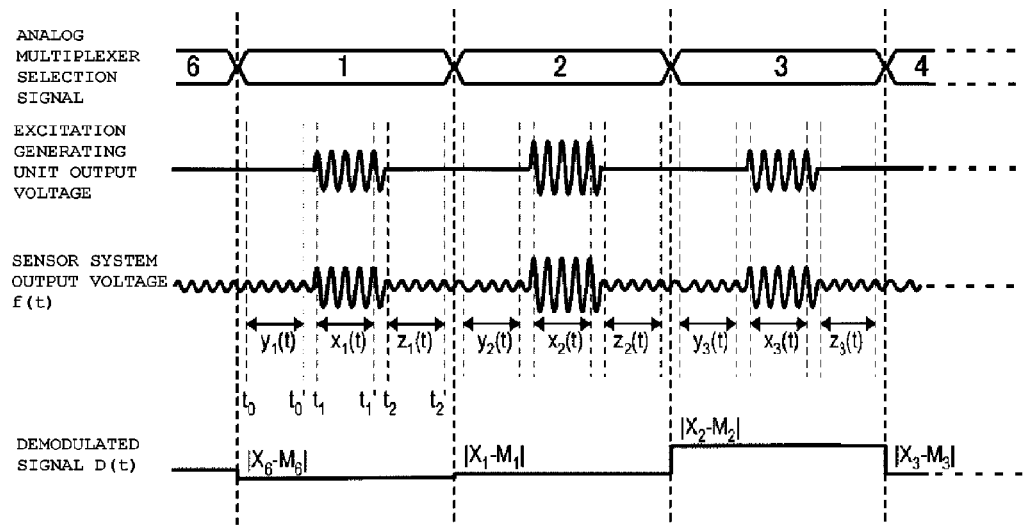
FIG. 28 is a timing chart of the electrostatic capacitive touch panel in Example 5 of the present invention.

The excitation generating unit 102 generates an intermittent sine wave voltage as illustrated in the second waveform from the top in FIG. 28. The voltage is used as an excitation of the sensor system. In order to obtain an output voltage of the excitation generating unit in FIG. 28, the excitation generating unit is supplied with a sine wave having a frequency of 100 kHz and an amplitude of 1.5 Vpp (1.5 volt peak to peak) by the sine wave generating unit 103 and with a DC voltage of 1.2 V by the DC generating unit 104. Then, the excitation generating unit 102 outputs an intermittent sine wave voltage having an offset of 1.2 V, a frequency of 100 kHz and an amplitude of 1.5 Vpp. In a period when the sine wave is stopped, a DC voltage of 1.2 V is output.

The voltage generated by the excitation generating unit 102 is applied to the sensor system 101. The voltage generated by the excitation generating unit 102 is applied to the non-inverting input terminal of the operational amplifier 110 in the sensor system, so that the voltage appears at the inverting input terminal due to imaginary shorting operation of the operational amplifier. In other words, when the excitation generating unit 102 outputs a voltage having a frequency of 100 kHz and an amplitude of 1.5 Vpp, a voltage having a frequency of 100 kHz and an amplitude of 1.5 Vpp is applied to an electrode selected by the multiplexer 201.

When the electrostatic capacitance $C_{in}$ is formed between a finger and the electrode as a finger approaches the electrode, alternating current flows from the sensor system 101 toward the finger through the $C_{in}$. An output of the sensor system 101 is a result obtained by superposing noise on an intermittent sine wave voltage whose amplitude is determined according to an amount of the alternating current. The output voltage of sensor system is denoted as f(t) in FIG. 28.

Operation of the demodulating unit 105 will be described. Of the output voltage f(t) of the sensor system 101, the demodulating unit 105 outputs an amplitude estimation value D(t) of a true signal of $x_n(t)$ by using signals $y_n(t)$, $x_n(t)$ and $z_n(t)$, with n being an integer and corresponding to a node number selected by the analog multiplexer 201 as illustrated in FIG. 28. The amplitude estimation value of the true signal is denoted as $|X_n - M_n|$ as detailed in Example 1.

As illustrated in FIG. 28, the controller 200 applies 1, 2, 3, ... 6 to the analog multiplexer selection signal, operation timing of the excitation generating unit 102 and operation timing of the demodulating unit 105. Sequential selection of the electrodes by the analog multiplexer results in sequentially obtaining demodulated signals corresponding to all the six electrodes, respectively.

Then, in the block including the signal processing circuit not shown, touching or non-touching and a touch position are calculated based on the output value of the demodulating unit 105. In the example as illustrated in FIG. 28, since $|X_2 - M_2|$ has a peak, a possibility is detected that a touch exists on the electrode H2. Then, when another peak is detected in $|X_5 - M_5|$, for example, possibilities are detected that a touch exists on the electrode V2 and that a touch exists at the center of the touch panel screen.

For the detection of a touch, such an algorithm is used, in addition to the above peak detection, as causes no erroneous determination by calculating a difference from a value obtained when no touch is made or using characteristics of a temporal change in a signal. Thus, touching or non-touching and a touch position (coordinates) are detected.

In the foregoing, $|X_n - M_n|$ described in Example 1 is applied as an output of the demodulating unit 105, $|X_n - k \cdot M_n|$ described in Example 2 to Example 4 may be applied as an output of the demodulating unit 105.

EXAMPLE 6

Other electrostatic capacitive touch panel of the present invention will be described. Example 4 illustrates an example of application to a mutual projected-capacitive type touch panel.

(Structure)

Figure 29:
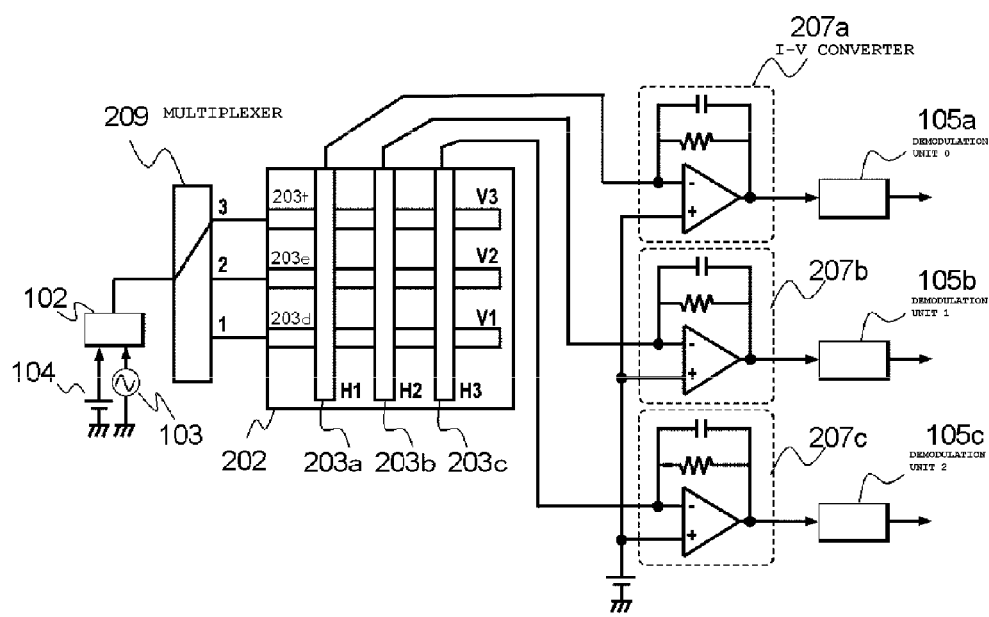
FIG. 29 is a block diagram of an electrostatic capacitive touch panel in Example 6 of the present invention.

FIG. 29 illustrates a configuration of an electrostatic capacitive touch panel of the present invention. In the present touch panel, a plurality of electrodes (H1: 203a, H2: 203b, H3: 203c and V1: 203d, V2: 203e, V3: 203f) are disposed on the transparent substrate 202. Consequently, nine intersections are formed on the substrate at which the electrodes intersect with each other. At each intersection, electrostatic capacitance is formed due to two electrodes intersecting with each other. When an indicator approaches the vicinity of an intersection, nearby lines of electric force change, so that a value of the electrostatic capacitance formed by the two intersecting electrodes changes. The present touch panel detects touching or non-touching and a touch position by detecting electrostatic capacitance formed by two intersecting electrodes.

The respective electrodes (203d, 203e, 203f) extending in a lateral direction are connected respectively to nodes 1 to node 3 of an analog multiplexer 209 by wiring, and the analog multiplexer 209 is connected to an output terminal of the excitation generating unit 102. The electrodes (203a, 203b, 203c) extending in a vertical direction are one-to-one connected to three I-V converters 207a, 207b and 207c by wiring. A configuration and operation of each of the I-V converters 207a, 207b and 207c are the same as those of 207 in Exemplary Embodiment 3. An output of the I-V converter is applied to the demodulating unit (105a, 105b, 105c).

The outputs of the demodulating units 105a to 105c are transmitted to a block including a signal processing circuit not shown, so that in the block including the signal processing circuit, touching or non-touching and a touch position are calculated based on the output values of the demodulations unit 105a to 105c.

The analog multiplexer 209, the excitation generating unit 102 and the demodulating units 105a to 105c are connected to a controller not shown so as to their operation and timing controlled.

In the present Example, although the number of electrodes is set to 6, it can be arbitrarily set and increasing the number enables the size of the touch panel to be increased or detection precision to be improved.

(Operation)

Figure 30:
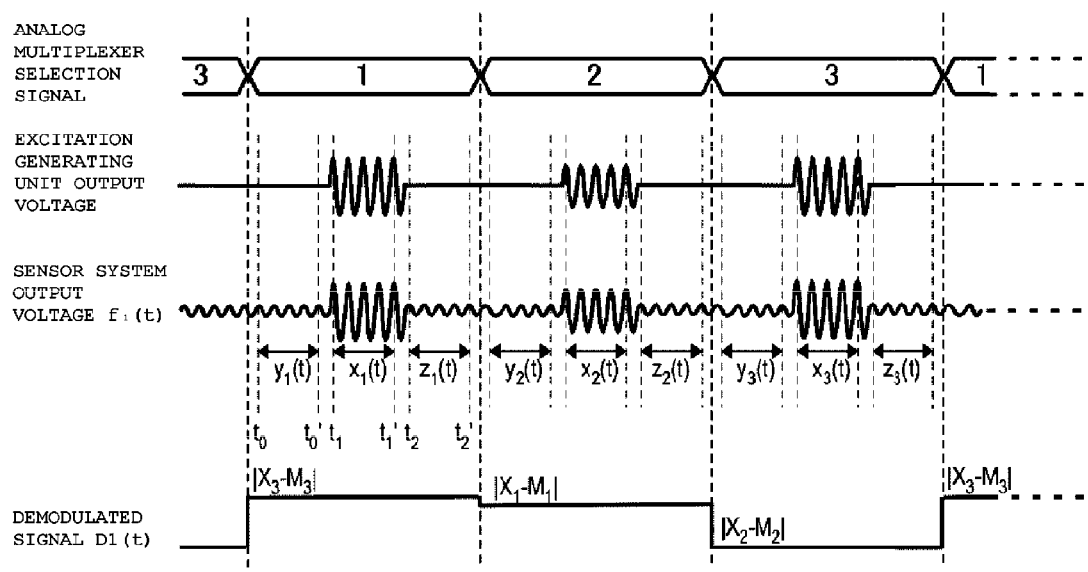
FIG. 30 is a timing chart of the electrostatic capacitive touch panel in Example 6 of the present invention.

With reference to FIG. 30, operation of the electrostatic capacitive touch panel of the present invention will be described. An analog multiplexer selection signal in FIG. 30 indicates a node number selected by the analog multiplexer 209 in FIG. 29.

One characteristic of drive of the present invention is that a period when one electrode is selected among V1, V2 and V3 by the analog multiplexer 209 has a period ($t_1$ to $t_1$) when a sine wave is applied to a selected electrode to detect touching and periods ($t_0$ to $t_0'$ and $t_2$ to $t_2'$) when noise is obtained while stopping a sine wave.

Since only external noise appears in an I-V converter output voltage in the period when the excitation generating unit 102 does not output a sine wave, i.e. in a sensor system output voltage in the period when the excitation generating unit 102 does not output a sine wave, obtaining this enables measurement of external noise with high precision. Then, making the most of the characteristic enables highly precise estimation and removal of noise to be mixed during the period ($t_1$ to $t_1'$) for detecting touching.

Since in the present Example, the three I-V converters 207a to 207c exist, output voltages of these I-V converters are referred to as $f_0(t)$, $f_1(t)$, and $f_2(t)$ to be distinguished. It is assumed here that $f_0(t)$ represents an output voltage of the I-V converter 207a connected to a demodulating unit 0:105a, $f_1(t)$ represents an output voltage of the I-V converter 207b connected to a demodulating unit 1:105b and $f_2(t)$ represents an output voltage of the I-V converter connected to a demodulating unit 2:105c.

FIG. 30 exemplifies $f_1(t)$ as a representative of the above three. Since the output voltage of the I-V converter can be considered as an output of the sensor system as described in Exemplary Embodiment 3, it is referred to as a sensor system output voltage in the figure.

The excitation generating unit 102 generates an intermittent sine wave voltage as illustrated in the second waveform from the top in FIG. 30. The voltage is used as an excitation of the sensor system. In order to obtain an output voltage of the excitation generating unit in FIG. 30, the excitation generating unit 102 is supplied with a sine wave having a frequency of 100 kHz and an amplitude of 1.5 Vpp (1.5 volt peak to peak) by the sine wave generating unit 103 and with a DC voltage of 1.2 V by the DC generating unit 104. Then, the excitation generating unit 102 outputs an intermittent sine wave voltage having an offset of 1.2 V, a frequency of 100 kHz and an amplitude of 1.5 Vpp. In a period when the sine wave is stopped, a DC voltage of 1.2 V is output.

The voltage generated by the excitation generating unit 102 is sequentially applied to the plurality of electrodes (V1 to V3) configuring the sensor system through the analog multiplexer 209.

When the electrostatic capacitances $C_{in(H1,V1)}$, $C_{in(H1,V2)}$ ... $C_{in(H3,V3)}$, with a subscript in a parenthesis assumed to be names of intersecting electrodes, are formed at nine intersection points at which the electrodes intersect with each other, and when a finger approaches a specific electrode, the value of the electrostatic capacitance is reduced. Then, the amplitude of the I-V converter is responsively reduced. The output voltage $f_1(t)$ of the I-V converter 207b connected to the demodulating unit 1:105b is illustrated in FIG. 30.

Operation of the demodulating unit 1 (105b) will be described. The demodulating unit 105b outputs an amplitude estimation value $D_1(t)$ of a true signal of $x_n(t)$ by using signals $y_n(t)$, $x_n(t)$ and $z_n(t)$ of the output voltage $f_1(t)$ of the sensor system, with n being an integer and corresponding to a node number selected by the analog multiplexer 209 as illustrated in FIG. 30. The amplitude estimation value of the true signal is denoted as $|X_n - M_m|$ as detailed in Example 1.

As illustrated in FIG. 30, the controller not shown applies, to the analog multiplexer selection signal, 1, 2, 3, 1, 2, 3, . . . , and also operation timing of the excitation generating unit 102 and operation timing of the demodulating unit 105a to 105c. Sequential selection of the electrodes by the analog multiplexer 209 results in sequentially applying an excitation to all the three electrodes V1, V2 and V3. On the other hand, pairs each composed of the I-V converter and the demodulating unit are connected to the three electrodes H1, H2 and H3, respectively, to output demodulated signals in parallel. Therefore, when the analog multiplexer finishes sequential selection, 1, 2, 3, demodulated signals corresponding to the electrostatic capacitances at all the nine intersection points can be obtained.

Then, in the block including the signal processing circuit not shown, touching or non-touching and a touch position are calculated based on the output values of the demodulating units 105a to 105c. In the example as illustrated in FIG. 30, a peak (minimum) is seen in a demodulated signal obtained when the analog multiplexer selects the node 2, i.e. $|X_2 - M_2|$. This enables detection of a possibility that a touch is made at the intersection point between the electrode H2 and the electrode V2.

For the detection of a touch, such an algorithm is used, in addition to the above peak detection, as causes no erroneous determination by calculating a difference from a value obtained when no touch is made or using characteristics of a temporal change in a signal. Thus, touching or non-touching and a touch position (coordinates) are detected.

In the foregoing, $|X_n - M_n|$ described in Example 1 is applied as an output of the demodulating units 105a to 105c, $|X_n - k \cdot M_n|$ described in Example 2 to Example 4 may be applied as an output of the demodulating units 105a to 105c.

It can be considered that the above-described Example 4 of the present invention has the following characteristics. Specifically, Example 4 includes a first electrode (i.e. the electrode V2), a second electrode (i.e. the electrode H2), and a sensor system configured with a driving circuit (corresponding to the excitation generating unit 102) which applies a voltage to the first electrode and a detecting circuit (207) which measures and outputs current flowing through the second electrode, and detects electrostatic capacitance of a capacitor formed by the first electrode and second electrode, thereby detecting a touching state or coordinates of an indicator.

In addition, the touch panel of the present invention includes the demodulating units 105a to 105c which demodulate an amplitude modulated signal as an output of the sensor system 205, in which the demodulating units 105a to 105c generate a demodulated signal using both a response of the sensor system in a period when the excitation generating unit 102 outputs a sine wave and a response of the sensor system in a period, at least either immediately before or immediately after the aforementioned period, when the excitation generating unit does not output a sine wave.

INDUSTRIAL APPLICABILITY

The present invention is applicable to electronic devices that use an amplitude modulation and demodulation system, such as electrostatic capacitance sensors, touch panels, touch sensors, and the like.

DESCRIPTION OF SYMBOLS

100: Electrostatic capacitance sensor
101: Sensor system
102: Excitation generating unit
103: Sinusoidal wave generating unit
104: DC generating unit
105, 105a, 105b, 105c, 105d: Demodulating unit
110: Operational amplifier
111: Adder
120: Electronic device
130: Electrostatic capacitive touch panel
131: Resistive sheet (ITO)
132: Polarizer
140: Sampler
141: Multiplier, 141a: Multiplier I, 141b: Multiplier Q
142: Integrator, 142a: Integrator I, 142b: Integrator Q
143: Register, 143a: Register I, 143b: Register Q
144: Multiplier, 144a: Multiplier I, 144b: Multiplier Q
145: Phase shifter
146: Controller
200: controller
201: multiplexer
202: substrate
203a, 203b, 203c, 203d, 203e, 203f: electrode
205: sensor system
206: electrostatic capacitance sensor
207: current voltage converter (I-V converter)
208: DC bias circuit
209: multiplexer

The invention claimed is:

1. An electronic apparatus comprising:
a sensor system;
an excitation generating unit which generates an intermittent sine wave signal and applies the intermittent sine wave signal to the sensor system; and
a demodulating unit which demodulates an amplitude modulated signal which is an output of the sensor system,
wherein the demodulating unit generates a demodulated signal using both a response of the sensor system in a period when the excitation generating unit outputs a sine wave and a response of the sensor system in a period, at least either immediately before or immediately after the aforementioned period, when the excitation generating unit does not output a sine wave, and
wherein with a vector as X, which is obtained from an amplitude and a phase, the amplitude and the phase being calculated from the response of the sensor system in a period in which the excitation generating unit has output the sine wave, by extracting a frequency component of the sine wave from the response of the sensor system, and with vectors as Y and Z, which are obtained from an amplitude and a phase, the amplitude and the phase being respectively calculated from the response of the sensor system in periods, immediately before and immediately after the aforementioned period, when the excitation generating unit does not output the sine wave, by extracting a frequency component of the sine wave from the response of the sensor system, the demodulated signal corresponds to a constant multiplication of |X−k·M| in which M represents a mean vector of Y and Z, and k represents a coefficient whose value is determined using a response of the sensor system in a period when the excitation generating unit does not output the sine wave.

2. An electrostatic capacitance sensor including the electronic apparatus according to claim 1, comprising:
a resistive sheet; and
a sensor system including a driving and detecting circuit connected to the resistive sheet for applying a voltage to the resistive sheet to measure and output current flowing through the resistive sheet,
wherein a touching state or coordinates of an indicator are detected by detecting an electrostatic capacitance of a capacitor formed by the resistive sheet and the indicator.

3. An electrostatic capacitance sensor including the electronic apparatus according to claim 1, comprising:
an electrode; and
a sensor system including a driving and detecting circuit connected to the electrode for applying a voltage to the electrode to measure and output current flowing through the electrode,
wherein a touching state or coordinates of an indicator are detected by detecting an electrostatic capacitance of a capacitor formed by the electrode and the indicator.

4. An electrostatic capacitance sensor including the electronic apparatus according to claim 1, comprising:
a first electrode;
a second electrode; and
a sensor system including a driving circuit which applies a voltage to the first electrode and a detecting circuit which measures and outputs current flowing through the second electrode,
wherein a touching state or coordinates of an indicator are detected by detecting an electrostatic capacitance of a capacitor formed by the first electrode and the second electrode.

5. The electrostatic capacitance sensor according to claim 2, comprising a display device,
wherein a non-address period of the display device has a period when the excitation generating unit outputs a sine wave and a period when the unit does not output a sine wave, and
wherein the demodulated signal is generated using both a response of the sensor system in the period when a sine wave is output and a response of the sensor system in the period when the sine wave is not output.

6. The electrostatic capacitance sensor according to claim 3, comprising a display device,
wherein a non-address period of the display device has a period when the excitation generating unit outputs a sine wave and a period when the unit does not output a sine wave, and
wherein the demodulated signal is generated using both a response of the sensor system in the period when a sine wave is output and a response of the sensor system in the period when the sine wave is not output.

7. The electrostatic capacitance sensor according to claim 4, comprising a display device,
wherein a non-address period of the display device has a period when the excitation generating unit outputs a sine wave and a period when the unit does not output a sine wave, and
wherein the demodulated signal is generated using both a response of the sensor system in the period when a sine wave is output and a response of the sensor system in the period when the sine wave is not output.

8. The electrostatic capacitance sensor according to claim 2, wherein a value of the coefficient k is determined using both amplitudes: an amplitude of a forward noise as a noise obtained at the time of non-output of a sine wave before the excitation generating unit outputs a sine wave; and an amplitude of a backward noise as a noise obtained at the time of non-output of a sine wave after the excitation generating unit outputs a sine wave.

9. The electrostatic capacitance sensor according to claim 3, wherein a value of the coefficient k is determined using both amplitudes: an amplitude of a forward noise as a noise obtained at the time of non-output of a sine wave before the excitation generating unit outputs a sine wave; and an amplitude of a backward noise as a noise obtained at the time of non-output of a sine wave after the excitation generating unit outputs a sine wave.

10. The electrostatic capacitance sensor according to claim 4 wherein a value of the coefficient k is determined using both amplitudes: an amplitude of a forward noise as a noise obtained at the time of non-output of a sine wave before the excitation generating unit outputs a sine wave; and an amplitude of a backward noise as a noise obtained at the time of non-output of a sine wave after the excitation generating unit outputs a sine wave.

11. A touch panel including the electronic apparatus according to claim 1, comprising:
a resistive sheet; and
a sensor system including a driving and detecting circuit connected to the resistive sheet for applying a voltage to the resistive sheet to measure and output current flowing through the resistive sheet,
wherein a touching state or coordinates of an indicator are detected by detecting an electrostatic capacitance of a capacitor formed by the resistive sheet and the indicator.

12. A touch panel including the electronic apparatus according to claim 1, comprising:
an electrode; and
a sensor system including a driving and detecting circuit connected to the electrode for applying a voltage to the electrode to measure and output current flowing through the electrode,
wherein a touching state or coordinates of an indicator are detected by detecting an electrostatic capacitance of a capacitor formed by the electrode and the indicator.

13. A touch panel including the electronic apparatus according to claim 1, comprising:
a first electrode;
a second electrode; and
a sensor system including a driving circuit which applies a voltage to the first electrode and a detecting circuit which measures and outputs current flowing through the second electrode, wherein a touching state or coordinates of an indicator are detected by detecting an electrostatic capacitance of a capacitor formed by the first electrode and the second electrode.

14. The electronic apparatus according to claim 1, comprising a display device, wherein
    a non-address period of the display device has a period when the excitation generating unit outputs a sine wave and a period when the unit does not output a sine wave, and
    a demodulated signal is generated using both a response of the sensor system in the period when the sine wave is output and a response of the sensor system in the period when the sine wave is not output.

15. The touch panel according to claim 11, comprising a display device, wherein
    a non-address period of the display device has a period when the excitation generating unit outputs a sine wave and a period when the unit does not output a sine wave, and
    a demodulated signal is generated using both a response of the sensor system in the period when the sine wave is output and a response of the sensor system in the period when the sine wave is not output.

16. The touch panel according to claim 12, comprising a display device, wherein
    a non-address period of the display device has a period when the excitation generating unit outputs a sine wave and a period when the unit does not output a sine wave, and
    a demodulated signal is generated using both a response of the sensor system in the period when the sine wave is output and a response of the sensor system in the period when the sine wave is not output.

17. The touch panel according to claim 13, comprising a display device, wherein
    a non-address period of the display device has a period when the excitation generating unit outputs a sine wave and a period when the unit does not output a sine wave, and
    a demodulated signal is generated using both a response of the sensor system in the period when the sine wave is output and a response of the sensor system in the period when the sine wave is not output.

* * * * *